(12) United States Patent
Dutta et al.

(10) Patent No.: US 8,369,149 B2
(45) Date of Patent: Feb. 5, 2013

(54) MULTI-STEP CHANNEL BOOSTING TO REDUCE CHANNEL TO FLOATING GATE COUPLING IN MEMORY

(75) Inventors: Deepanshu Dutta, Santa Clara, CA (US); Jeffrey W. Lutze, San Jose, CA (US); Henry Chin, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 170 days.

(21) Appl. No.: 12/894,889

(22) Filed: Sep. 30, 2010

(65) Prior Publication Data

US 2012/0081963 A1    Apr. 5, 2012

(51) Int. Cl.
*G11C 11/34* (2006.01)
(52) U.S. Cl. .............................. 365/185.17; 365/185.22
(58) Field of Classification Search .............. 365/185.17, 365/185.22
See application file for complete search history.

(56) References Cited

U.S. PATENT DOCUMENTS

| 7,023,733 | B2 | 4/2006 | Guterman et al. |
| 7,411,827 | B2 | 8/2008 | Gutermn et al. |
| 7,535,763 | B2 | 5/2009 | Hemink |
| 7,567,459 | B2 * | 7/2009 | Shim ........................ 365/185.17 |
| 7,800,950 | B2 * | 9/2010 | Park et al. ................. 365/185.19 |
| 2008/0117684 | A1 | 5/2008 | Hemink |
| 2008/0123425 | A1 | 5/2008 | Lutze et al. |
| 2008/0123426 | A1 | 5/2008 | Lutze et al. |
| 2009/0059660 | A1 | 3/2009 | Lee et al. |
| 2009/0207657 | A1 | 8/2009 | Tamada |
| 2009/0257281 | A1 | 10/2009 | Lee |
| 2009/0323429 | A1 | 12/2009 | Lee et al. |
| 2010/0091575 | A1 | 4/2010 | Kim |

OTHER PUBLICATIONS

International Search Report & The Written Opinion of the International Searching Authority dated Dec. 23, 2011, International Patent Application No. PCT/US2011/053768.
U.S. Appl. No. 12/616,269, filed Nov. 11, 2009.

* cited by examiner

*Primary Examiner* — Son Dinh
*Assistant Examiner* — Nam Nguyen
(74) *Attorney, Agent, or Firm* — Vierra Magen Marcus & DeNiro LLP

(57) ABSTRACT

In a programming operation, selected storage elements which reach a lockout condition are subject to reduced channel boosting in a program portion of the next program-verify iteration, to reduce coupling effects on the storage elements which continue to be programmed. In subsequent program-verify iterations, the locked out storage elements are subject to full channel boosting. Or, the boosting can be stepped up over multiple program-verify iterations after lockout. The amount of channel boosting can be set by adjusting the timing of a channel pre-charge operation and by stepping up pass voltages which are applied to unselected word lines. The reduced channel boosting can be implemented for a range of program-verify iterations where the lockout condition is most likely to be first reached, for one or more target data states.

28 Claims, 16 Drawing Sheets

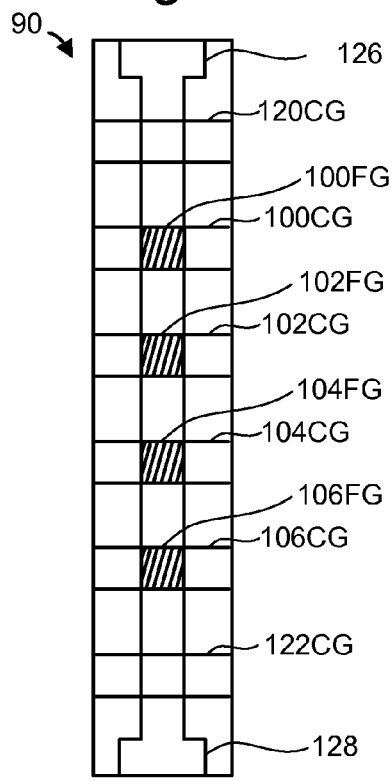
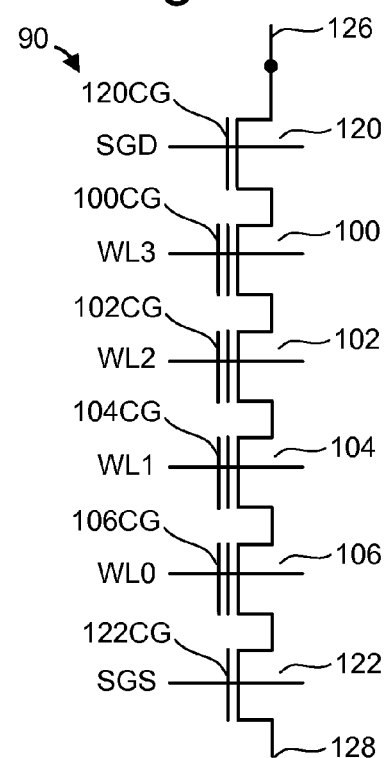
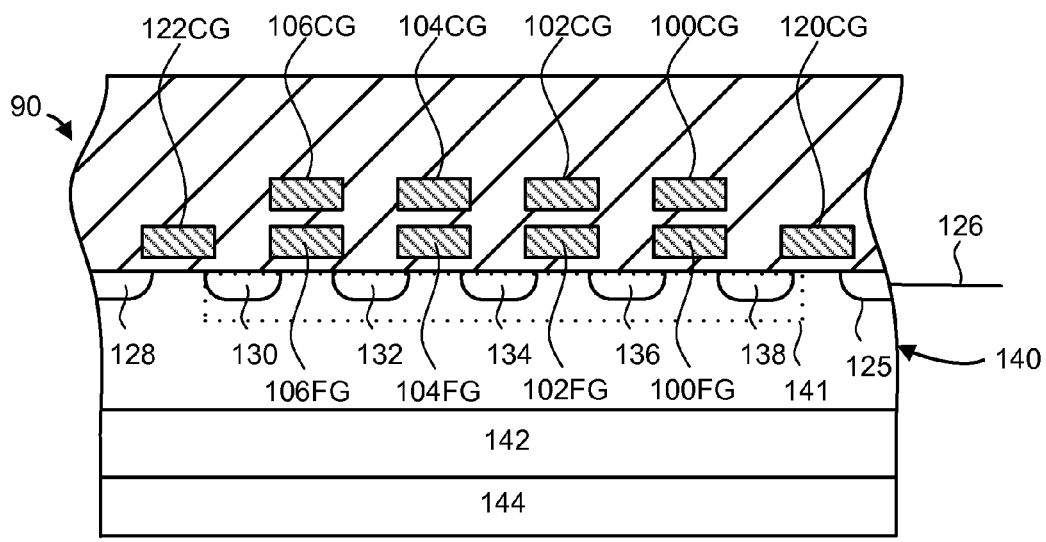

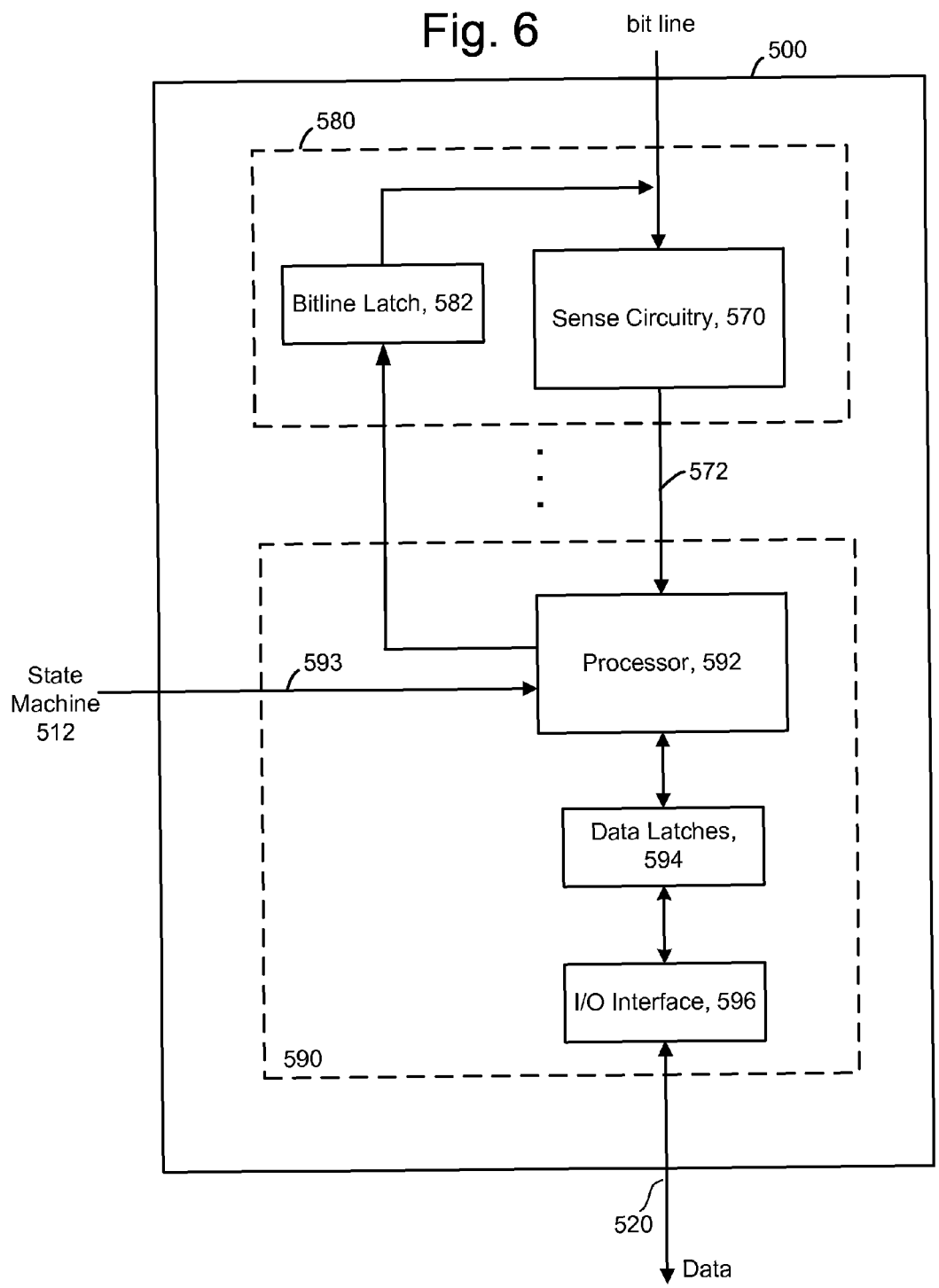

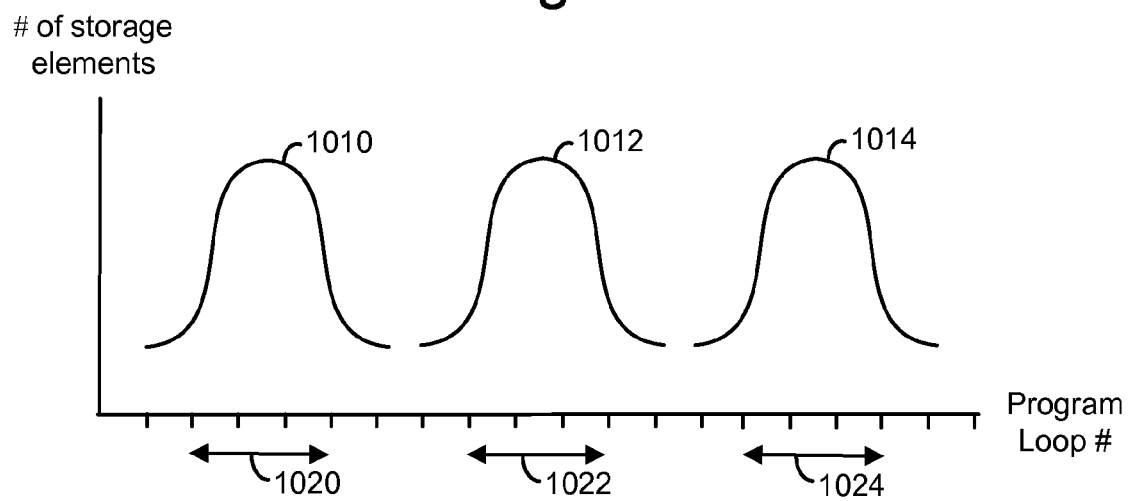

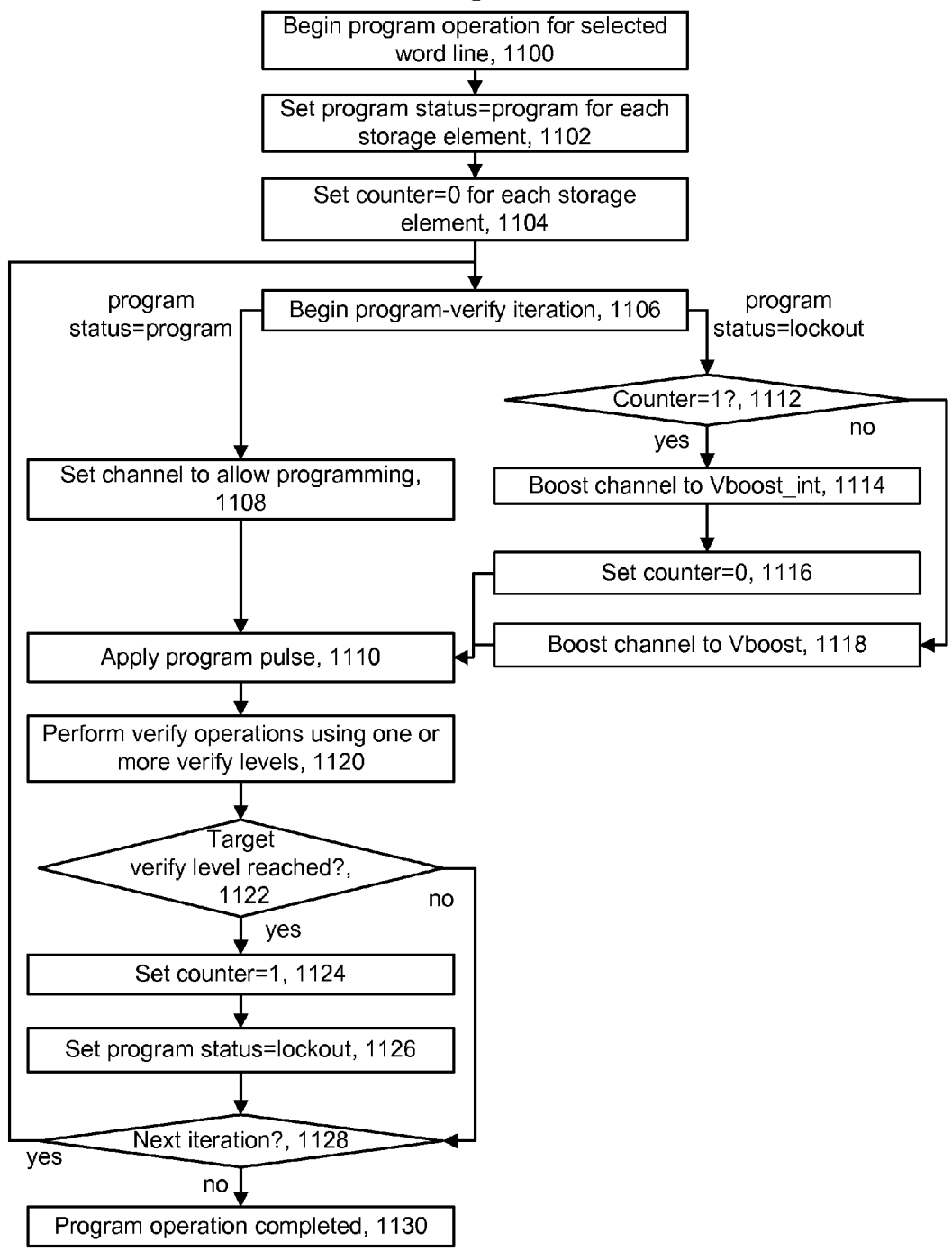

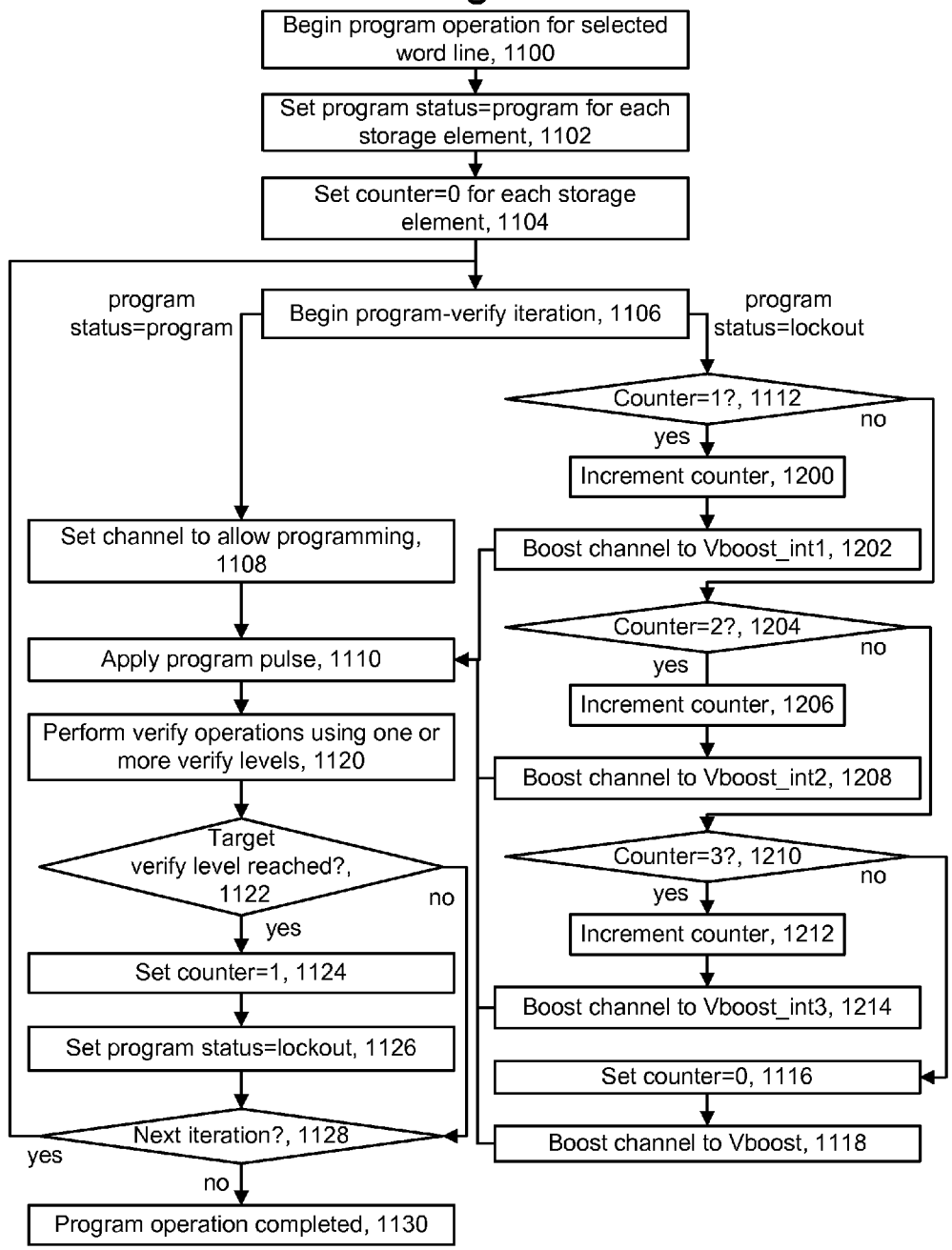

MULTI-STEP CHANNEL BOOSTING TO REDUCE CHANNEL TO FLOATING GATE COUPLING IN MEMORY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, electromagnetic coupling effects in memory devices are becoming increasingly important as memory device dimensions are scaled down.

BRIEF DESCRIPTION OF THE DRAWINGS

FIG. 1A is a top view of a NAND string.

FIG. 1B is an equivalent circuit diagram of the NAND string.

FIG. 2 is a cross-sectional view of the NAND string.

FIG. 6 is a block diagram depicting one embodiment of a sense block.

FIG. 10E depicts selected program loop intervals in which a reduced channel boosting technique can be implemented.

FIG. 11 depicts a process for programming selected storage elements in which one intermediate boosting level is used in a program loop which is immediately after a program loop in which storage element reaches a lockout condition, as depicted in FIG. 10C.

FIG. 12 depicts a process for programming selected storage elements in which different intermediate boosting levels are used in the three program loops which are immediately after a program loop in which a storage element reaches a lockout condition, as depicted in FIG. 10D.

DETAILED DESCRIPTION

Figure 3:
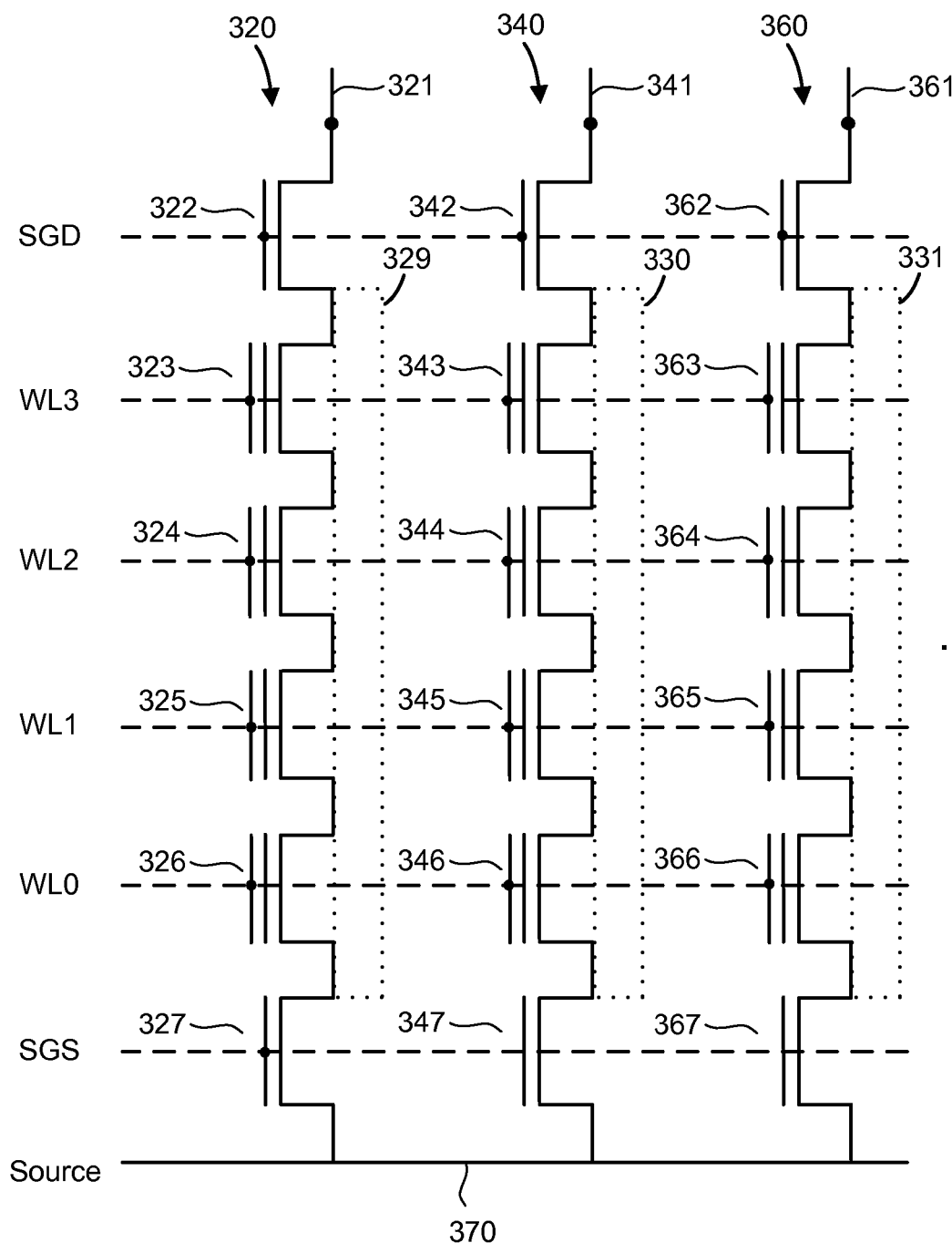
FIG. 3 is a circuit diagram depicting three NAND strings.

A method and non-volatile storage system are provided in which channel boosting is optimized to reduce electromagnetic coupling effects.

During a programming operation, unselected storage elements which have previously completed programming to a target data state are inhibited or locked out from further programming by boosting associated substrate channel regions. Generally, it important for an appropriate amount of boosting to be used. If the boosting is too low, an inhibited storage element may experience program disturb, in which its threshold voltage is raised to a next higher data state, or to a level at which the storage element cannot be accurately read. On the other hand, if boosting is too high, electromagnetic coupling effects can raise the threshold voltages of the unselected storage elements excessively, resulting in undesirable widening of the threshold voltage distributions.

It has been determined that one or more program-verify iterations which immediately follow a program-verify iteration in which a storage element is locked out, are most critical. By using one or more reduced channel boosting levels during these one or more program-verify iterations, coupling effects are reduced on the remaining storage elements which have not yet reached the lockout condition. Thus, the channel boosting level can be tailored to the timing of when the lockout condition was reached for a given storage element, so that a reduced level of boosting is provided when the lockout condition was reached more recently, and a higher level of boosting is provided when the lockout condition was reached less recently.

To achieve the reduced channel boosting levels, various channel boosting schemes are provided using specified voltages for bit lines, drain-side select gates and/or drain-side dummy storage elements, during a period before pass voltages are applied, and/or during a period when pass voltages are applied in steps.

One example of a suitable memory system uses the NAND flash memory structure, which arranges multiple transistors in series between two select gates. The transistors in series and the select gates are referred to as a NAND string. FIG. 1A is a top view showing one NAND string 90. FIG. 1B is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one embodiment, transistors 100, 102, 104 and 106 are each memory cells. In other embodiments, the memory cells may include multiple transistors or may be different than that depicted. Select gates 120 and 122 are connected to drain-side select line SGD and source-side select line SGS, respectively.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 125 connects to the bit line 126 for the NAND string, while N+ doped layer 128 connects to a common source line for multiple NAND strings. Some NAND strings will include 8, 16, 32, 64 or more memory cells. Each memory cell can store data represented in analog or digital form, in one or more bits.

Other types of non-volatile memory in addition to NAND flash memory can also be used.

As part of a programming operation, the potential of a channel region of the substrate which is associated with an unselected storage element and, e.g., an unselected NAND string 90, can be boosted. An unselected storage element or NAND string may be referred to as an inhibited or locked out storage element or NAND string as it is inhibited or locked out from programming in a given programming iteration of a programming operation. For example, channel region 141 may be provided in the p-well 140 of the substrate 144 when any of the storage elements which are provided by control gates and floating gates 100CG/100FG, 102CG/100FG, 104CG/104FG and 106CG/106FG is an unselected storage element in a programming operation, e.g., when the NAND string 90 is an unselected NAND string. The channel region 141 represents a conductive path in the substrate, extending in and between the doped regions 130, 132, 134, 136 and 138. Boosting can be achieved in different ways. For example, in a pre-charge operation, which occurs before a pass voltage is applied to an unselected word line, a voltage supplied on the bit line 126 can be passed to the channel 141 via the drain-side select gate transistor 120CG. In one possible scenario, with an appropriate bit line voltage, the drain-side select gate transistor provides a voltage of Vcg−Vth to the channel, where Vcg is the control gate voltage, and Vth is the threshold voltage, of the drain-side select gate transistor. The drain-side select gate transistor may subsequently be rendered non-conductive so that the bit line is cutoff from the channel 141, and the boosted potential is maintained in the channel. Channel boosting can also be achieved by applying pass voltages to the word line and maintaining the drain-side select gate transistor non-conductive. The pass voltages couple to the channel, raising its potential. Various channel boosting schemes are discussed in detail further below.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line 370 by its select gates (e.g., select gates 327, 347 or 367). A selection line SGS is used to control the source side select gates. The various NAND strings 320, 340 and 360 are connected to respective bit lines 321, 341 and 361, by drain-side select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Example channel regions 329, 330 and 331 which are associated with the NAND strings 320, 340 and 360, respectively, may be created in the substrate. Note that the storage elements and channel regions are depicted as if they were rotated 90 degrees from their actual position.

Word lines are connected to the control gates for storage elements as follows: WL3 (storage elements 323, 343 and 363), WL2 (storage elements 324, 344 and 364), WL1 (storage elements 325, 345 and 365), and WL0 (storage elements 326, 346 and 366). Each word line connects the control gates of each storage element in the row. Or, the control gates may be provided by the word lines themselves.

When programming a flash storage element, a program voltage is applied to the control gate of the storage element, e.g., via an associated word line, and the bit line associated with the storage element is grounded. Electrons from the channel are injected into the floating gate. When electrons accumulate in the floating gate, the floating gate becomes negatively charged and the Vth of the storage element is raised.

Figure 4:
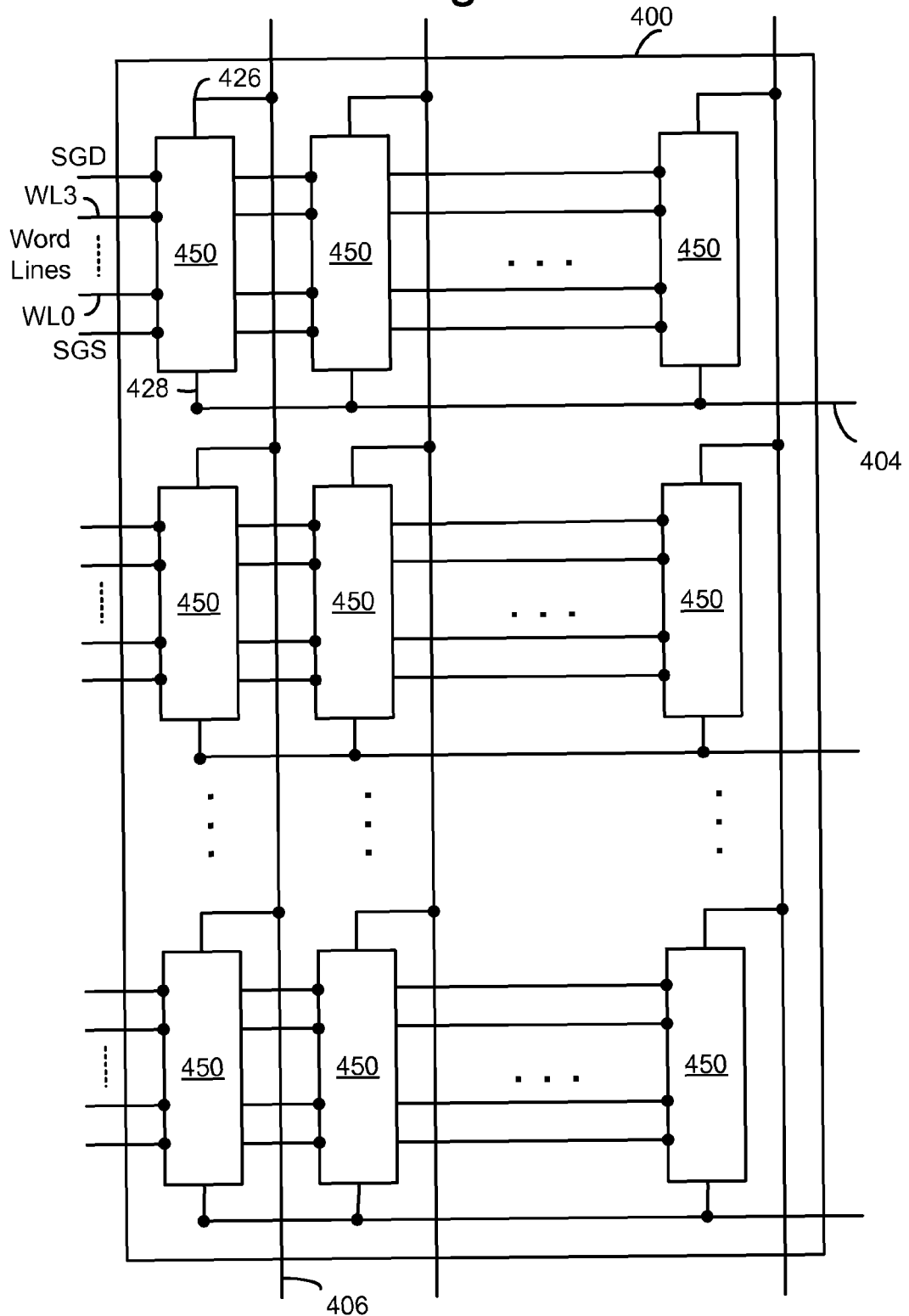
FIG. 4 is a block diagram of an array of NAND flash storage elements.

FIG. 4 illustrates an example of an array 400 of NAND storage elements, such as those shown in FIGS. 1A and 1B. Along each column, a bit line 406 is coupled to the drain terminal 426 of the drain-side select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. A large number of pages form a block, anywhere from 8 pages, for example, up to 32, 64, 128 or more pages. In some embodiments, a row of NAND strings comprises a block.

Figure 5:
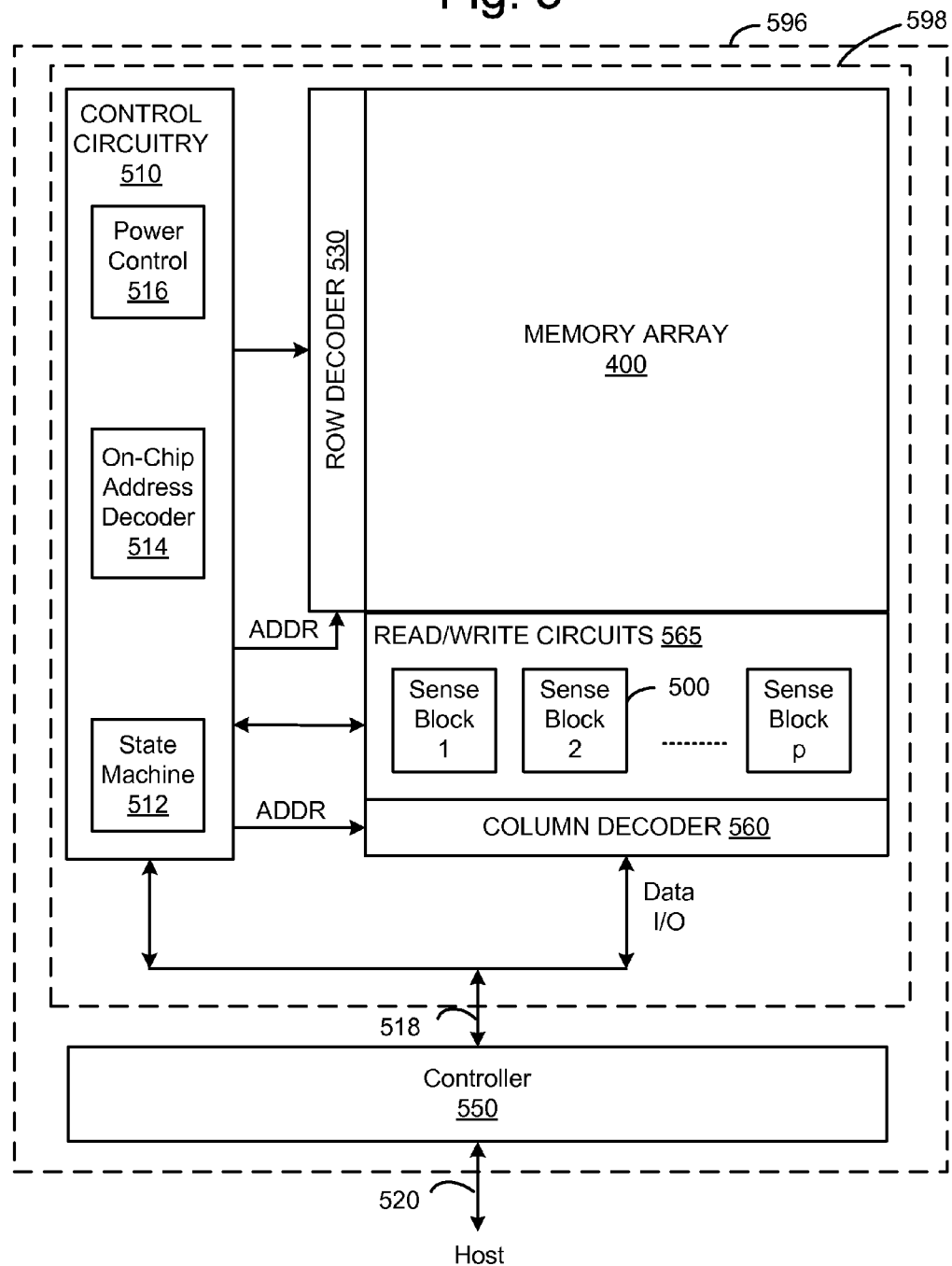
FIG. 5 is a block diagram of a non-volatile memory system using single row/column decoders and read/write circuits.

FIG. 5 is a block diagram of a non-volatile memory system using single row/column decoders and read/write circuits. A memory device 596 having read/write circuits for reading and programming a page of storage elements in parallel, according to one embodiment. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, power control 516, sense blocks 500, read/write circuits 565, controller 550, and so forth.

In another embodiment, a non-volatile memory system uses dual row/column decoders and read/write circuits. Access to the memory array 400 by the various peripheral circuits is implemented in a symmetric fashion, on opposite sides of the array.

FIG. 6 is a block diagram depicting one embodiment of a sense block. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected, bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. See also FIG. 13. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During reading or other sensing, a state machine 512 controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During program or verify, the data to be programmed is stored in the set of data latches 594 from the data bus 520. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
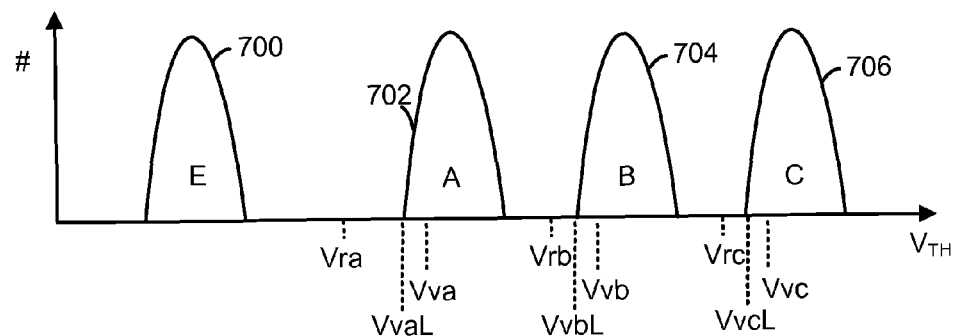
FIG. 7A depicts an example set of threshold voltage distributions.

FIG. 7A depicts an example set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8A:
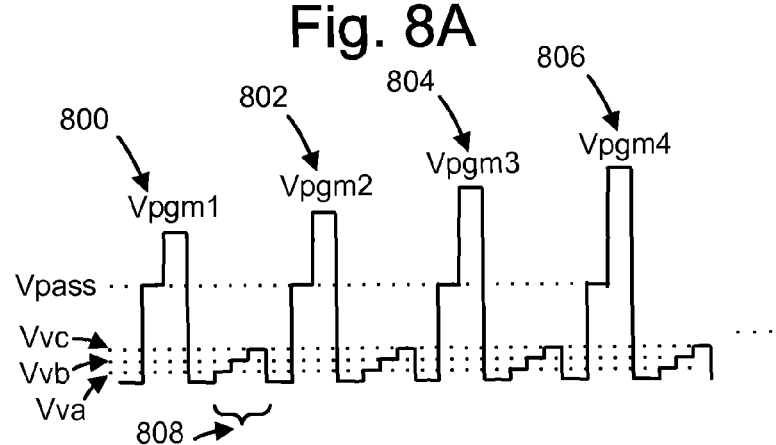
FIG. 8A depicts a series of program and verify pulses which are applied to a selected word line during a programming operation.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses such as depicted in FIG. 8A will then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some case, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
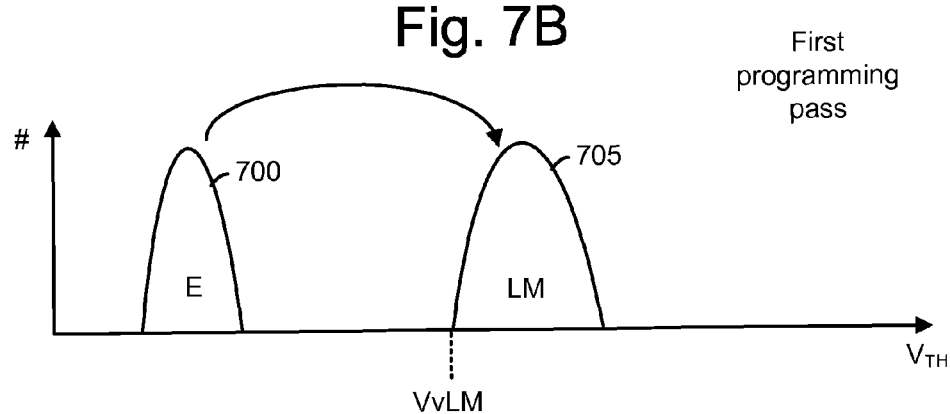
FIG. 7B illustrates a first pass of a two-pass programming technique.

FIG. 7B illustrates a first pass of a two-pass programming technique. In this example, a multi-state storage element that stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower middle) state (distribution 705).

Figure 8B:
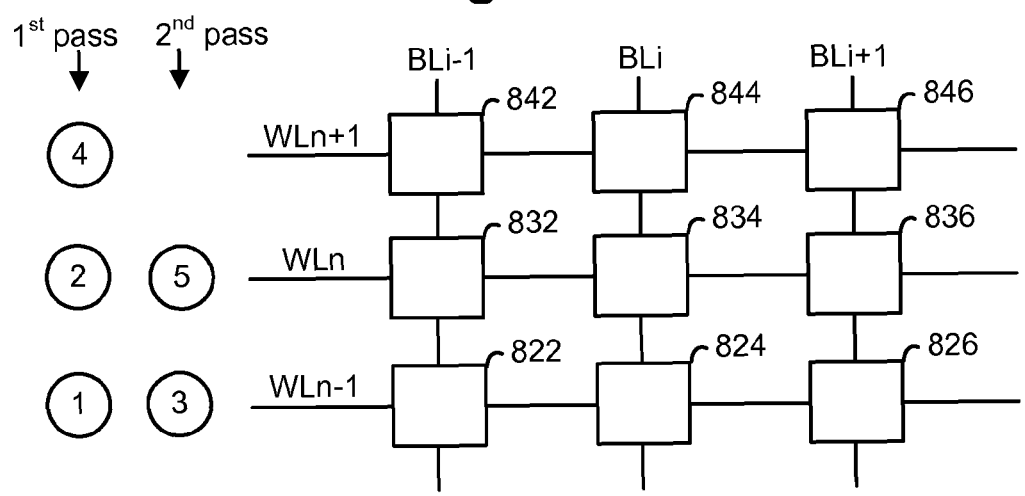
FIG. 8B depicts a multi-pass program operation for a set of storage elements.

In one embodiment, after a storage element is programmed from the E-state to the LM-state, as indicated by step "1" in FIG. 8B, its neighbor storage element on an adjacent word line WLn+1 in the NAND string will then be programmed with respect to its lower page in a respective first programming pass of the adjacent word line, as indicated by step "2" in FIG. 8B.

Figure 7C:
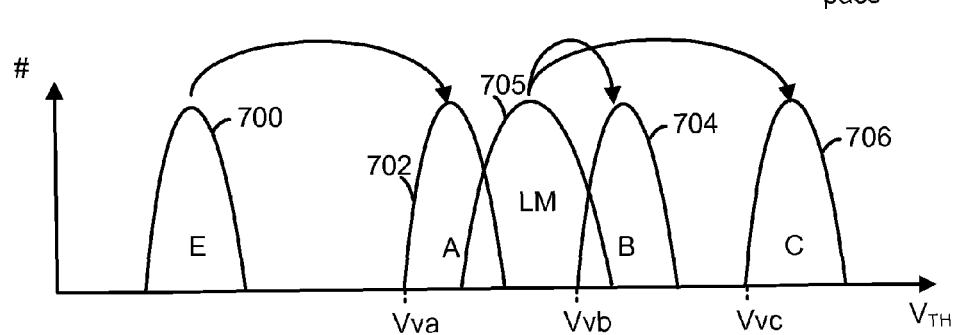
FIG. 7C illustrates a second pass of the two-pass programming technique of FIG. 7B.

FIG. 7C illustrates a second pass of the two-pass programming technique of FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706. The second pass of the two-pass programming technique for WLn is indicated by step "3" in FIG. 8B. The second pass of the two-pass programming technique for WLn+1 is indicated by step "5" in FIG. 8B.

Figure 7D:
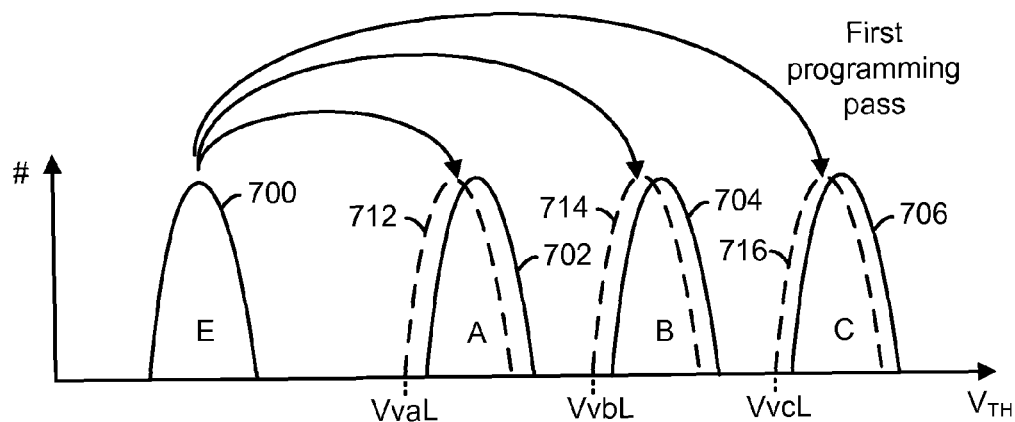
FIG. 7D illustrates a first pass of another two-pass programming technique.

FIG. 7D illustrates a first pass of another two-pass programming technique. In this example, referred to as foggy-fine programming, the A-state, B-state and C-state storage elements are programmed from the E-state to distributions 712, 714 and 716, respectively, using lower verify levels VvaL, VvbL and VvcL, respectively. This is the foggy programming pass. A relatively large program voltage step size may be used, for instance, to quickly program the storage elements to the respective lower verify levels.

Figure 7E:
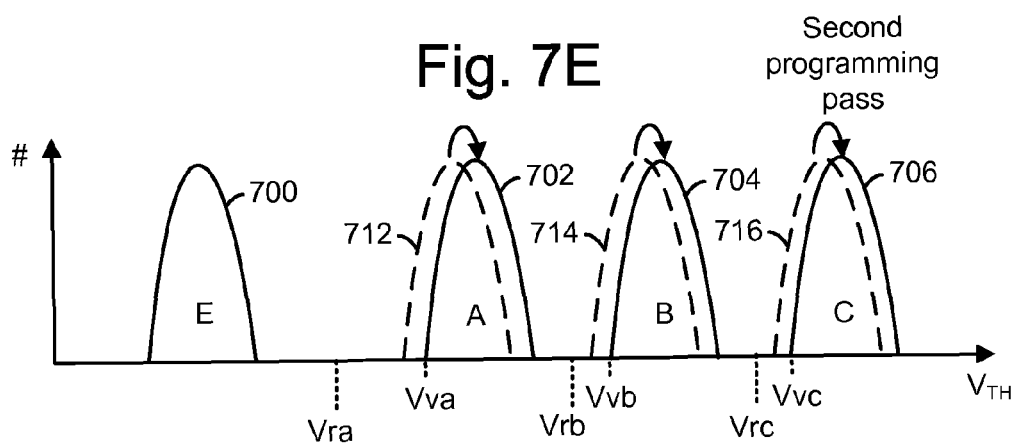
FIG. 7E illustrates a second pass of the two-pass programming technique of FIG. 7D.

FIG. 7E illustrates a second pass of the two-pass programming technique of FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts taught can be applied to other implementations with more or fewer than four states and more or fewer than two pages. For example, memory devices with eight or sixteen states per storage element are currently planned or in production.

Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

FIG. 8A depicts a series of program and verify pulses which are applied to a selected word line during a programming operation. A programming operation may include multiple program-verify iterations, where each iteration applies a program voltage followed by verify voltages, to a selected word line. In one possible approach, the program voltages are stepped up in successive iterations. Moreover, each program voltage may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, a Vpgm3 and Vpgm4, respectively, and so forth. One or more verify voltages, such as example verify voltages Vva, Vvb and Vvc (808), may be provided after each program pulse. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

FIG. 8B depicts a multi-pass program operation for a set of storage elements. The components depicted may be a subset of a much larger set of storage elements, word lines and bit lines. In one possible program operation, storage elements on WLn−1, e.g., storage elements 802, 824 and 826, are programmed in a first programming pass. This step is represented by the circled "1." Next ("2"), storage elements on WLn, e.g., storage elements 832, 834 and 836, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1, e.g., storage elements 842, 844 and 846, are programmed in a first programming pass. Next ("5"), the storage elements on WLn are programmed in a second programming pass to their respective target states.

Figure 9:
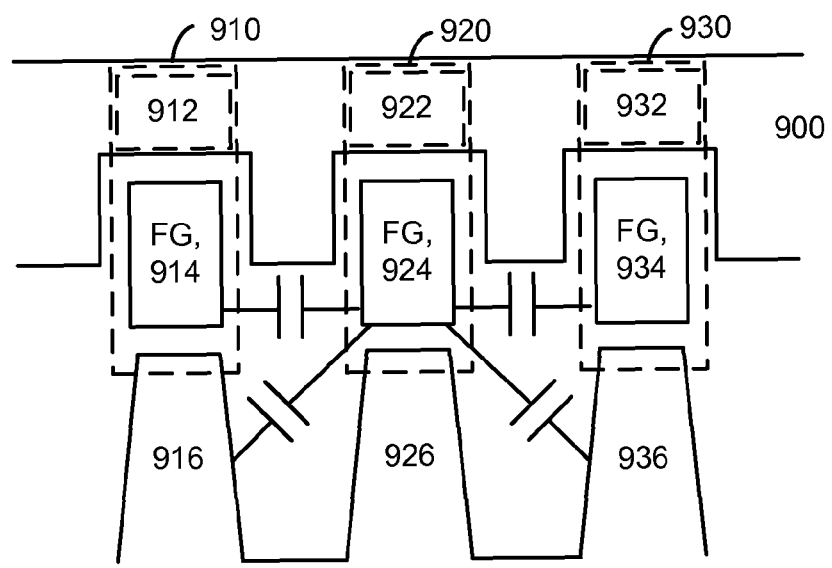
FIG. 9 depicts a cross-sectional view of NAND strings showing channel-to-floating gate coupling and floating gate-to-floating gate coupling.

FIG. 9 depicts a cross-sectional view of NAND strings showing channel-to-floating gate coupling and floating gate-to-floating gate coupling. A bit line or NAND string direction goes into the page, and a word line direction goes from left to right. A word line 900 extends across multiple NAND strings. A first NAND string includes a channel region 916. A storage element 910 in the first NAND string includes a control gate 912, which is a portion of the word line 900, and a floating gate 914. A second NAND string includes a channel region 926. A storage element 920 in the second NAND string includes a control gate 922, which is a portion of the word line 900, and a floating gate 924. A third NAND string includes a channel region 936. A storage element 930 in the third NAND string includes a control gate 932, which is a portion of the word line 900, and a floating gate 934.

As memory devices are scaled down, storage element-to-storage element interferences play an increasingly important role. One of these interferences is channel-to-floating gate coupling during programming. In all-bit line programming, consider a selected storage element 920 of a selected word line which undergoes programming. When a storage element (e.g., 910 or 930) of a neighbor bit line, on the same word line 900, reaches its target data state, it is locked out or inhibited from further programming. In the next program iteration, a substrate channel region (e.g., 916 or 936) of the locked out storage element is boosted to prevent the floating gate (e.g., 914 or 934) of the storage element from being programmed further when a program pulse is applied to the selected word line. The boosted potential in the channel couples up to the floating gate 924 of the selected storage element 920, leading to an increase in the effective program voltage (Vpgm) which is seen by the selected storage element when a program pulse is applied. This results in a larger jump in the Vth of the selected storage element than is desired. The Vth distributions of the storage elements can therefore be widened undesirably. In addition to this channel-to-floating gate coupling, floating gate-to-floating gate also further increase the effective Vpgm which is seen by a selected storage element. This is represented by coupling from floating gates 914 and/or 934 to floating gate 924.

Moreover, in a more severe case, if both of the adjacent neighbor storage elements of a selected storage element lock out together, then during the next program iteration their channels will both be inhibited. The neighbor channels (e.g., 916 and 936) will be boosted to Vchannel, so that their floating gates (e.g., 914 and 934) are also boosted to a higher potential. Whenever a channel is boosted, a part of Vchannel gets coupled to the floating gate and hence raises the floating gate potential. For example, about 15% of Vchannel in the neighbor channels 916 and 936 may be coupled to the floating gates 914 and 934, respectively. Both Vchannel and the neighbor floating gate potential couple up to the floating gate 924 of the selected storage element and increase the effective Vpgm. The amount of coupling depends on Vchannel, coupling from the channel (916 and/or 936) to the floating gate (914 and/or 934), and coupling from the floating gates 914 and/or 934 to the floating gate 924. With scaling, these couplings become greater, resulting in an increase of the magnitude of the capacitive coupling effect described above.

One approach for reducing coupling includes programming even and odd numbered bit lines separately so that for each storage element, the neighbor storage element or a neighbor bit line is always in an inhibit state. While this scheme is effective, it has a significant performance penalty since programming time is increased. Another approach is to float the bit lines and channels for the still-programming storage elements. In case a neighbor storage element locks out, the floated bit line and channel couples up to a higher value that slows down programming of the storage element and hence self-compensates for the coupling. However, this approach has reduced effectiveness due to parasitic couplings to the floating bit line.

In a proposed approach, reduced channel boosting is provided for storage elements during the program portion of one or more program-verify iterations which are immediately after a program-verify iteration in which the lockout condition was reached. This approach reduces coupling experienced by the selected storage elements and can lead to tighter Vth distributions, resulting in better endurance and/or better performance.

Figure 10A:
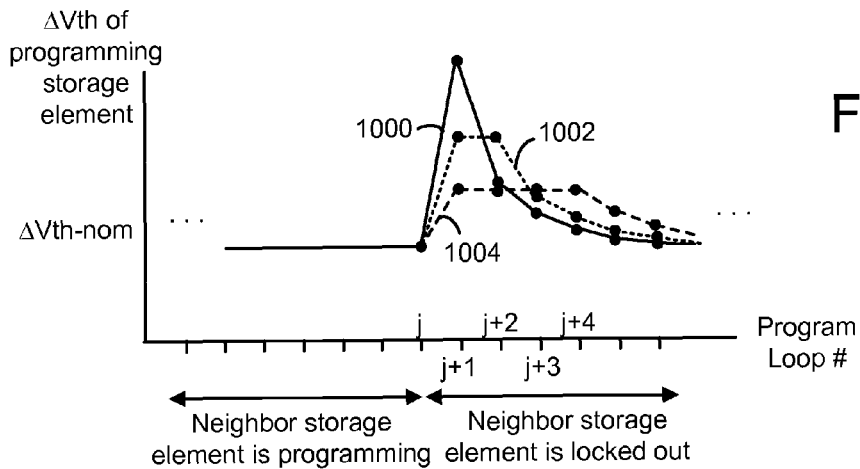
FIG. 10A depicts a capacitive coupling effect which occurs when a neighboring storage element reaches a lockout condition.

FIG. 10A depicts a capacitive coupling effect which occurs when a neighboring storage element reaches a lockout condition. The x-axis depicts a program loop number, which is a number of program-verify iterations in a programming operation. The programming operation can represent a one-pass programming technique, or a single pass of a multi-pass programming technique. A programming pass begins with a first program loop and continues until all or most storage elements have completed programming, or until a maximum allowed number of program loops have been completed.

The y-axis depicts a change in the threshold voltage (Vth) of a storage element which continues to undergo programming and does not reach the lockout condition in the time period depicted. A fixed Vpgm step size is assumed but is not required. Typically, when each program pulse is applied, the Vth of a storage element will increase at a nominal level, $\Delta$Vth-nom, which is almost equal to the Vpgm step size. At each program pulse, the Vpgm seen by the storage element steps up by the amount equal to the Vpgm step size, which results in electrons being injected into the floating gate of the storage element leading to an increase in its Vth by $\Delta$Vth-nom that is almost equal to the Vpgm step size. In such a case, the storage element is considered to be under steady state programming. This nominal increase in $\Delta$Vth occurs in a time period up to the jth program loop during which, one or both neighbor storage elements are assumed to be still programming and have not reached the lockout condition. In the time period after the jth program loop, the one or both neighbor storage elements are assumed to have reached the lockout condition.

Thus, at the jth program loop, the one or both neighbor storage elements reach the lockout condition, e.g., they are verified to have reached a target Vth level which is associated with a data state. On the j+1th program pulse, the channels of the inhibited neighbor storage element(s) is (are) fully boosted to Vboost level, which also raises the voltage of floating gates belonging to the inhibited storage elements. As described earlier, the coupling from the boosted channel and floating gate of the neighboring storage element raises the effective Vpgm seen by the selected storage element. Thus, the change in Vpgm seen by the storage element from the jth to j+1th program pulse is larger than the Vpgm step size. This results in a $\Delta$Vth that is substantially larger than $\Delta$Vth-nom, as shown on curve 1000. The sudden large $\Delta$Vth disturbs the selected storage element from its original steady state programming. On subsequent program pulses, the channels of inhibited storage elements are again boosted to the same boost levels and hence result in the same amount of coupling to the floating gate of selected storage element. Thus, the change in Vpgm seen by the storage element returns to the same level as the Vpgm step size. Even though the change in Vpgm returns back to Vpgm step size immediately on j+2th program pulse, the storage element $\Delta$Vth still remains higher than $\Delta$Vth-nom since it takes few pulses for the storage element to return back to a steady state programming. With subsequent program pulses, the selected storage element approaches a new steady state where $\Delta$Vth at each program pulse returns to $\Delta$Vth-nom. As shown on curve 1000, the $\Delta$Vth gradually reduces until it settles back to $\Delta$Vth-nom.

Note that in a given program loop, different storage elements can be verified to reach target verify levels of different target data states, in a multi-level device such as one having four or more data states. For example, assume there is an erased state E and programmed states A, B and C. Typically, the A-state storage elements will reach the lockout condition first, then the B-state storage elements will reach the lockout condition, and finally the C-state storage elements will reach the lockout condition. The E-state storage elements are not programmed during the programming pass. Due to manufacturing variations, it is possible, e.g., for a faster C-state storage element to lockout at the same time as a slower B-state storage element. The techniques for reducing coupling provided herein are effective in these different scenarios.

In this example, a full level of channel boosting is used for the channels regions which are associated with the one or both neighbor storage elements, starting at the j+1th program loop, so that a substantial amount of capacitive coupling is realized. In practice, the coupling effect will be less if the two neighboring storage elements reach the lockout condition at different program loops, than if they reach the lockout condition at the same program loop. The curves of FIG. 10A are meant to representation a typical scenario.

Figure 10B:
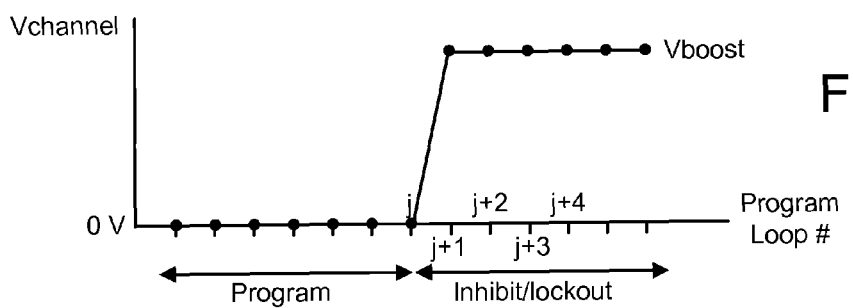
FIG. 10B depicts channel boosting for a storage element which reaches a lockout condition, where no intermediate boosting level is used.
Figure 10C:
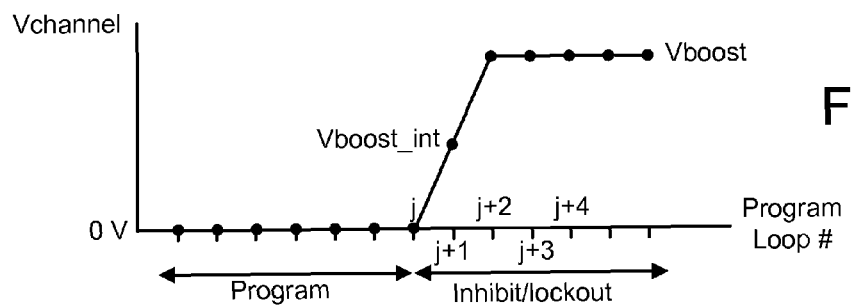
FIG. 10C depicts channel boosting for a storage element which reaches a lockout condition, where one intermediate boosting level is used.

Curve 1000 represents $\Delta$Vth of the selected storage element, when the channel(s) of the one or both neighbor storage elements is (are) boosted up to the full Vboost level during the j+1th program loop, as depicted in FIG. 10B. In this case, the deviation of $\Delta$Vth from $\Delta$Vth-nom is greatest because the full channel boosting of the neighbor storage elements couples up to the selected element and hence leads to a larger $\Delta$Vth. In contrast, curve 1002 represents $\Delta$Vth when the channels are boosted to a reduced, intermediate channel boost level of Vboost_int during the j+1th program loop, and boosting to the full Vboost level is delayed until the j+2th program loop, as depicted in FIG. 10C. The j+2th program loop is a second next program-verify iteration after a storage element reaches the lockout condition. In this case, on the j+1th program pulse, since the channels are boosted to Vboost_int only, the coupled voltage to the floating gate of the selected storage element is lower than in the case depicted in FIG. 10B. Thus the effective Vpgm change seen by the selected storage element on the j+1th program pulse is reduced, which results in ΔVth on the j+1th program pulse being reduced relative to curve 1000. On the j+2th program pulse, the inhibited channels are boosted at the full Vboost level. This change in Vchannel from Vboost_int to Vboost results in the effective Vgm change again being higher than the Vpgm step size, and hence resulting in ΔVth again being larger than ΔVth-nom. Note that in both of the cases depicted in FIG. 10B and FIG. 10C, the initial and final Vchannel levels are the same, and Vchannel makes a transition from 0V to Vboost. The only difference is that in the case of FIG. 10C, the transition from 0V to Vboost takes place over 2 program pulses as opposed to one program pulse in the case of FIG. 10B. By making the 0 V to Vboost transition more gradual, an abrupt change in effective Vpgm is replaced by a more gradual change which results in ΔVth deviating lesser from ΔVth-nom. Thus, a single large ΔVth increase seen on the j+1th program pulse in curve 1000, is replaced by two relatively smaller ΔVth increases on the j+1th and j+2th program pulses.

Figure 10D:
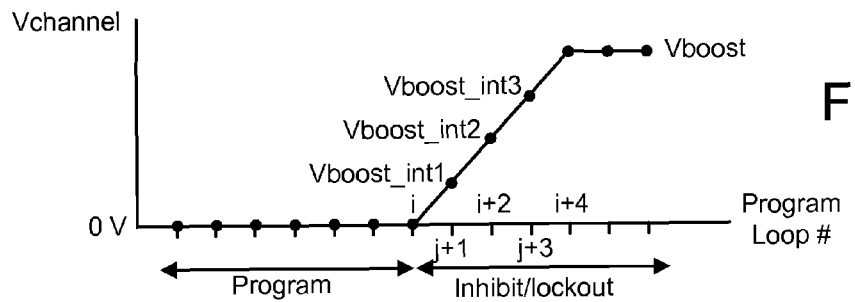
FIG. 10D depicts channel boosting for a storage element which reaches a lockout condition, where three intermediate boosting levels are used.

As a further example, curve 1004 represents ΔVth when three reduced, intermediate channel boost levels of Vboost_int1, Vboost_int2 and Vboost_int3 are applied during the j+1th, j+2th and j+3th program loops, respectively, and the full Vboost is delayed until the j+4th program loop, as depicted in FIG. 10D. In this case, the transition from 0V to Vboost is further spread across four program pulses as opposed to being spread across two program pulses in the case of FIG. 10C. Thus, instead of two large ΔVth steps on the j+1th and j+2th program pulses, as shown in curve 1002, we use four relatively smaller ΔVth jumps on the j+1th, j+2th, j+3th and j+4th program pulses.

From a point of view of the Vth distribution, the most critical factor is the ΔVth jump the storage element takes just before going beyond its target verify-level and getting locked out. The larger the ΔVth jump on that pulse, the greater the resulting Vth distribution widening. In the case of curve 1000, the maximum Vth distribution widening will occur if the selected storage element receives a large ΔVth at j+1th program pulse and goes beyond its target verify-level. Such storage elements have a higher likelihood of ending up in the extreme upper-edge of the Vth distribution and thus lead to a wider Vth distribution. Thus, in curve 1000, if the peak ΔVth can be lowered, the Vth widening caused can also be reduced. This is achieved in curve 1002 where we have two relatively smaller ΔVth jumps at the j+1th and j+2th program pulses. Note that by spreading the capacitive coupling effect across two program pulses, the chances of a storage element being impacted by it, increases. But, on the other hand, the magnitude of the effect is reduced since the ΔVth jump is lowered. Among these competing forces, the peak ΔVth jump is a stronger factor since a smaller ΔVth jump is hidden among other factors that lead to Vth distribution widening. In general, spreading a single large ΔVth jump into multiple smaller ΔVth jumps generally results in a tighter Vth distribution. Thus, Vth distributions are expected to be tighter for the case depicted in FIG. 10C than for the case depicted in FIG. 10B, and are expected to be tightest for the case depicted in FIG. 10D.

As can be seen, a substantial decrease in the step up of peak ΔVth above ΔVth-nom can be realized by providing a gradual increase in Vchannel for the channel region associated with a locked out storage element in one or more program loops which immediately follow a program loop in which the storage element reaches the lockout condition. Note that while using more than one intermediate boosting level achieves a greater benefit, there is a tradeoff in complexity as it is necessary to keep track of more program loops after lockout for each specific storage element. This can result in a greater demand for latches, for instance (see FIG. 13). Also, additional time is consumed in configuring multiple channel boosting levels.

FIG. 10B depicts channel boosting for a storage element which reaches a lockout condition, where no intermediate boosting level is used. The x-axis is the same as in FIG. 10A, and the y-axis depicts a channel voltage, Vchannel, of a storage element which is the neighboring storage element of the programming storage element of FIG. 10A. For program loop j and earlier, the storage element is still programming, and the channel boost level can be 0 V, or a small level such as 0.6 V which is used to only partially inhibit, but not lockout, programming. During the program portion of program loop j, the storage element reaches the inhibit or lockout condition, in which it remains until the end of the programming pass. The full channel boost level of Vboost is used for program loops j+1 and later, including j+2, j+3, j+4 and so forth. The magnitude of Vboost can vary based on the level of Vpass, among other factors.

It is convenient to specify that the particular boosting level which is depicted (e.g., Vboost) is reached at a time at which the highest amplitude portion of the program pulse is applied, e.g., during Vpgm1, Vpgm2, Vpgm3, Vpgm4, ... in FIG. 8A. Vboost is the highest boosting level which is reached during programming.

FIG. 10C depicts channel boosting for a storage element which reaches a lockout condition, where one intermediate boosting level is used. The x-axis is the same as in FIG. 10A, and the y-axis is the same as in FIG. 10B. For program loop j and earlier, the storage element is still programming, and the channel boost level can be at 0-0.6 V, as mentioned. Thus, the channel region associated with a storage element which has not been locked out is at a level which allows programming to continue.

At the program portion of program loop j, the storage element reaches the inhibit or lockout condition, in which it remains until the end of the programming pass. An intermediate channel boost level Vboost_int is used for program loop j+1, and Vboost is used for program loops j+2 and later, including j+3, j+4 and so forth. Here, Vboost_int<Vboost. Vboost_int can be roughly 50% to 75% of Vboost, as an example. Vboost_int can be considered to be a first lockout level for boosting and Vboost can be considered to be a second lockout level for boosting.

FIG. 10D depicts channel boosting for a storage element which reaches a lockout condition, where three intermediate boosting levels are used. The x-axis is the same as in FIG. 10A, and the y-axis is the same as in FIG. 10B. For program loop j and earlier, the storage element is still programming, and channel boost level can be 0-0.6 V, as mentioned. At the program portion of program loop j, the storage element reaches the inhibit or lockout condition, in which it remains until the end of the programming pass. A first intermediate channel boost level, Vboost_int1 is used for program loop j+1, a second intermediate channel boost level Vboost_int2 is used for program loop j+2, a third intermediate channel boost level Vboost_int3 is used for program loop j+3 and Vboost is used for program loops j+4 and later.

The j+3th program loop is a third next program-verify iteration after a storage element reaches the lockout condition, and the j+4th program loop is a fourth next program-verify iteration after a storage element reaches the lockout condition. Here, Vboost_int1<Vboost_int2<Vboost_int3<Vboost. As an example, Vboost_int1 can be roughly ¼*Vboost, Vboost_int2 can be roughly ½*Vboost and Vboost_int3 can be roughly ¾*Vboost. Vboost_int2 can be the same as Vboost_int from FIG. 10C.

Vboost_int1, Vboost_int2 and Vboost_int3 can be considered to be first, second and third lockout levels, respectively, for boosting and Vboost can be considered to be a fourth lockout level for boosting.

Note that the relationships depicted in FIGS. 10A-D can be provided for each storage element, and the value j is specific to each storage element. For instance, a first storage element can lock out at a 5th program loop so that j=5, and a second storage element can lock out at a 10th program loop so that j=10.

Also, a reference to boosting a channel to a given level can be analogous to boosting a channel using a given boosting technique. For instance, Vboost_int, Vboost_int1, Vboost_int2, Vboost_int3 and Vboost can be achieved using different boosting techniques.

FIG. 10E depicts selected program loop intervals in which a reduced channel boosting technique can be implemented. The x-axis depicts a program loop number and the y-axis depicts a number of storage elements. In FIGS. 10A-10D it was shown that providing channel boosting at a reduced level for one or more program loops after a storage element reaches the lockout condition can be beneficial. Specifically, a peak jump in ΔVth above ΔVth-nom due to capacitive coupling can be reduced. However, implementing the reduced channel boosting such as discussed further below in connection with FIGS. 14-17 can consume additional time, so there is a tradeoff between increased programming time and reduced capacitive coupling. As a recognition of this tradeoff, the reduced channel boosting can be implemented in limited situations. For example, a majority of the storage elements which are programmed to a same target verify level of a data state tend to reach the lockout condition at about the same program loop, as depicted by distributions 1010, 1012 and 1014 for A-state, B-state and C-state target verify levels, respectively. Recall that a target verify level of a data state can be a verify level such as VvaL or Vva for the A-state, VvbL or Vvb for the B-state, and VvcL or Vvc for the C-state, as discussed in connection with FIG. 7A.

For the storage elements which are programmed to an associated verify level, the level of the channel boosting can be a function of the program loop number of the program-verify iteration at which the storage element reaches the associated verify level. That is, reduced channel boosting can be implemented only for certain program loops. For the A-state distribution 1010, for instance, reduced channel boosting may be used only for a range of program loop numbers depicted by the arrow 1020. For the normal-programming A-state storage elements which reach lockout in the range 1020, reduced channel boosting is used in the next one or more program loops, after which full channel boosting is used. For the fast-programming A-state storage elements which reach lockout before the range 1020, and for the slow-programming A-state storage elements which reach lockout after the range 1020, full channel boosting is used in the next one or more program loops.

Similarly, for the B-state distribution 1012, reduced channel boosting may be used only for a range of program loop numbers depicted by the arrow 1022. For the normal-programming B-state storage elements which reach lockout in the range 1022, reduced channel boosting is used in the next one or more program loops, after which full channel boosting is used. For the fast-programming B-state storage elements which reach lockout before the range 1022, and for the slow-programming B-state storage elements which reach lockout after the range 1022, full channel boosting and not reduced channel boosting is used in the next one or more program loops.

For the C-state distribution 1014, reduced channel boosting may be used only for a range of program loop numbers depicted by the arrow 1024. For the normal-programming C-state storage elements which reach lockout in the range 1024, reduced channel boosting is used in the next one or more program loops, after which full channel boosting is used. For the fast-programming C-state storage elements which reach lockout before the range 1024, and for the slow-programming C-state storage elements which reach lockout after the range 1024, full channel boosting and not reduced channel boosting is used in the next one or more program loops.

Thus, the reduced channel boosting can be implemented for a fixed number of program loops, starting at a specified program loop number, and stopping at another specified program loop number, for each programmed target verify level and associated data state. The start and stop loop numbers for each state can be fixed and stored in a ROM fuse, for instance. The ROM fuse may be a reserved area in the non-volatile memory array 400 of FIG. 5 for storing system data. Optimum start and stop loop numbers can be determined from testing and device characterization.

In one option, the start loop number is adaptive, e.g., based on a determination of when a specified number of storage elements reach an associated verify level. For example, the start of the range 1020 may begin when a specified number of A-state storage elements reach an associated verify level. The number of program loops in the range can be fixed, e.g., set by a ROM fuse. The start of the range 1022 may begin when a specified number of B-state storage elements reach an associated verify level, and the start of the range 1024 may begin when a specified number of C-state storage elements reach an associated verify level. Or, the start of the range 1022 may be set to be a first fixed number of program loops after the start of the range 1020, and the start of the range 1024 may be set to be a second fixed number of program loops after the start of the range 1020. A combination of the techniques described above may also be used.

FIG. 11 depicts a process for programming selected storage elements in which one intermediate boosting level is used in a program loop which is immediately after a program loop in which storage element reaches a lockout condition, as depicted in FIG. 10C.

At step 1100, a program operation begins for a selected word line. At step 1102, a program status variable is set to "program" for each storage element of the word line which is to be programmed to a target verify level. For instance, this could be A-, B- and C-state storage elements in a four state implementation. At step 1104, a counter is set to "0" for each storage element of the word line which is to be programmed to a target verify level. At step 1106, a program-verify iteration begins. For a storage element for which program status=program, step 1108 indicates that the associated channel is set to a level which allows programming, such as 0-0.6 V. Step 1110 applies a program pulse to the selected word line. Step 1120 performs a verify operation using one or more verify levels. At decision step 1122, if a target verify level is reached, counter is set to "1" at step 1124 and program status is set to "lockout" at step 1126. If there is a next iteration of the programming operation at decision step 1128, the progress continues with the next program-verify iteration at step 1106. At decision step 1122, if the target verify level is not reached, processing continues at decision step 1128. If there is no next iteration of the programming operation at decision step 1128, the programming operation or pass is completed at step 1130.

Decision step 1122 determines if at least one storage element has been programmed sufficiently so that the at least one storage element reaches a lockout condition, where the at least one storage element reaches the lockout condition during an associated program-verify iteration of a plurality of program-verify iterations.

At step 1106, for a storage element for which program status=lockout, decision step 1112 determines if counter=1. Counter=1 indicates that the current program-verify iteration or program loop is the first next program loop following the program loop in which the storage element reached the lockout condition (e.g., the j+1 program loop). If decision step 1112 is true, step 1114 boosts the associated channel region of the storage element to the intermediate or reduced level of Vboost_int (a first lockout level) of FIG. 10C, and step 1116 sets counter=0. The program pulse is then applied at step 1110. If decision step 1112 is false, step 1118 boosts the associated channel region of the storage element to the full level of Vboost of FIG. 10C. Note that the two branches depicted in FIG. 11 for program status=program and program status=lockout can be followed concurrently for different storage elements.

When a locked out storage element pass through the right hand branch of the process a second time, in the j+2th loop (the second next program-verify iteration), counter=0 at decision step 1112, so that boosting to Vboost (a second lockout level) at step 1118 occurs. Boosting of the channel region to Vboost in step 1118 can be repeated during a program portion of each remaining program-verify iteration or program loop until the current programming pass is completed at step 1130.

As mentioned, with multi-pass programming, reduced channel boosting levels can be used in one or more of the programming passes. For a multi-pass programming scheme, the final programming pass tends to be the most critical pass in terms of determining the Vth distribution width. Thus, reduced channel boosting levels are most effective on the final programming pass. However, reduced channel boosting levels can be used on a programming pass which is before a final programming pass of a multi-pass programming operation.

Another option is to limit the use of the reduced channel boosting levels to specific program loops, such as discussed in connection with FIG. 10E. Furthermore, the reduced channel boosting levels may be omitted for highest data state, such as the C-state when four states are used, since a reduced programming precision can be tolerated for the highest data state.

FIG. 12 depicts a process for programming selected storage elements in which different intermediate boosting levels are used in the three program loops which are immediately after a program loop in which a storage element reaches a lockout condition, as depicted in FIG. 10D. The like-numbered steps are the same as in FIG. 11. The storage elements for which program status=program are handled the same as in FIG. 11. Regarding the storage elements for which program status=locked out, the counter is used to keep track of whether the current program loop is the first, second, third or fourth or later, program loop after the program loop in which the storage element reaches the lockout condition. To achieve this, if decision step 1112 indicates that counter=1, the counter is incremented at step 1200 and the channel is boosted to Vboost_int1 at step 1202, before the program pulse is applied at step 1110. If decision step 1112 is false, and decision step 1204 indicates that counter=2, the counter is incremented at step 1206 and the channel is boosted to Vboost_int2 at step 1208, before the program pulse is applied at step 1110. If decision step 1204 is false, and decision step 1210 indicates that counter=3, the counter is incremented at step 1212 and the channel is boosted to Vboost_int3 at step 1214, before the program pulse is applied at step 1110. If decision step 1210 is false, the counter is reset to "0" at step 1116 and the channel is boosted to Vboost at step 1118, before the program pulse is applied at step 1110.

Figure 13:
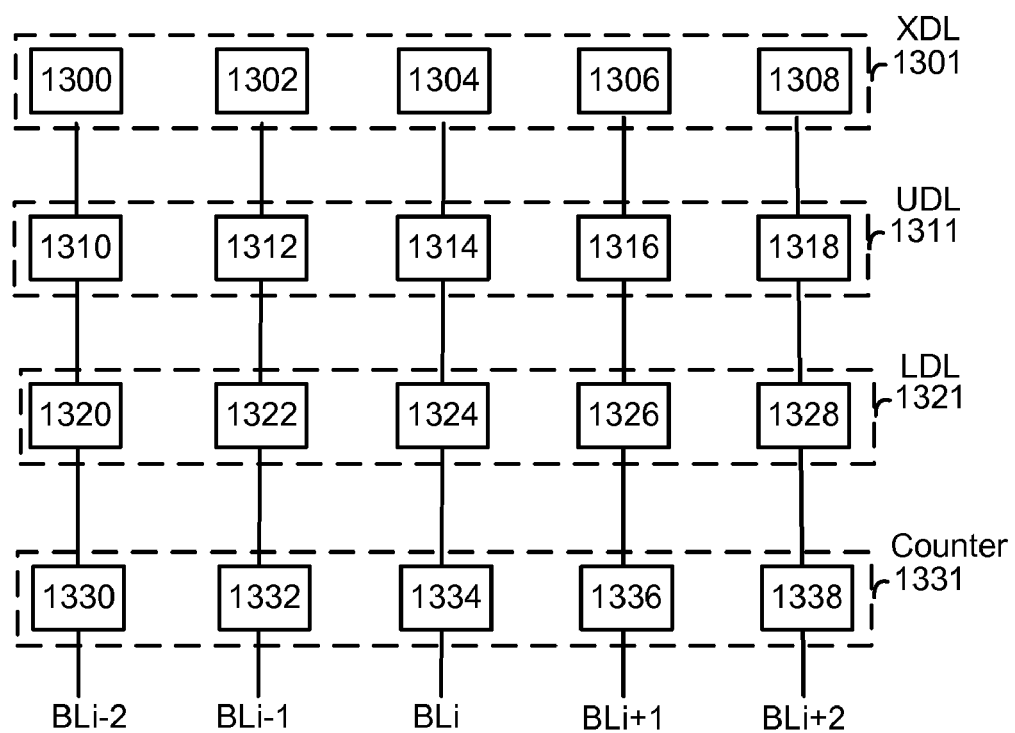
FIG. 13 depicts the use of data latches for respective bit lines.

FIG. 13 depicts the use of data latches for respective bit lines. Generally, data latches, each storing one bit of data, can be provided for each bit line. The latches identify when an associated storage element has reached certain mileposts in a programming operations. For example, latches may identify that a storage element has not yet completed programming (e.g., its Vth is below a verify level such as Vva, Vvb or Vvc in FIG. 7A), or has completed programming (e.g., its Vth is above a verify level). Latches may also identify that storage element's Vth is below a lower verify level (e.g., VvaL or VvbL in FIG. 7A), is above a lower verify level (e.g., VvaL or VvbL) but below a higher or target verify level (e.g., Vva, Vvb or Vvc), e.g., in a slow programming mode, or is above the higher or target verify level.

A first set of latches 1301, referred to as XDL latches, includes latches 1300, 1302, 1304, 1306 and 1308. The XDL latches can be used to store a lower page of data, for instance. An XDL latch is flipped when a lower page bit is stored in an associated storage element. A second set of latches 1311, referred to as UDL latches, includes latches 1310, 1312, 1314, 1316 and 1318. A UDL latch is flipped when an associated storage element is in a slow programming mode, e.g., when its Vth is between lower and target verify levels. A third set of latches 1321, referred to as LDL latches, includes latches 1320, 1322, 1324, 1326 and 1328. The latches are connected to representative bit lines BLi−2, BLi−1, BL, BLi+1 and BLi+2. The LDL latches can be used to store an upper page of data, for instance. An LDL latch is flipped when an associated storage element completes programming, e.g., when its Vth exceeds a target verify level such as Vva, Vvb or Vvc.

In some detection schemes, once any storage element is locked out, all the data latches (XDL, LDL, UDL) for that storage element set to "1". However, this does not allow distinguishing between storage elements which have been locked out at different data states. For example, an E-state storage element cannot be distinguished from a locked out A-, B- or C-state storage element. Similarly, all locked out storage elements are indistinguishable. Thus, a storage element that is locked out on the last, most recent program pulse cannot be distinguished from storage elements that have been locked out for more than one program pulse. Thus, to implement the multi-step channel boosting scheme described here, an extra data latch may be required.

A fourth set of latches 1331, referred to as counter latches, includes latches 1330, 1332, 1334, 1336 and 1338. In one approach which corresponds to FIGS. 10B and 11A, each latch stores a 1 value for a storage element to indicate that, in the current program loop, the storage element is not being locked out for the first time. This can correspond to counter=0 in FIG. 11. That is, in the current program loop, the storage element is not locked out at all, or the storage element was locked out for the first time more than one program loop previously. Further, each latch can be flipped to a 0 value (corresponding to counter=1 in FIG. 11) for a storage element to indicate that in the current program loop, the storage element is being locked out for the first time. That is, the storage element reached the lockout condition on the previous program loop. One counter latch per storage element is sufficient when two possible boost conditions—Vboost_int and Vboost—are used for locked out storage elements. A "1" indicates that Vboost is used, and a "0" indicates that Vboost_int is used, for instance. The value in the counter latch does not matter until the storage element has reached the lockout condition, as indicated by the other latches. The first flipping of the latch value signals that a reduced boosting mode should be used, and the second flipping of the latch value signals that a full boosting mode should be used.

Thus, responsive to determining that has storage element has been programmed sufficiently so that it reaches a lockout condition, at least one control can be used to change data in at least one latch which is associated with the at least one storage element, where the boosting of the channel region associated with the at least one storage element during the program portion of the first next program-verify iteration (at Vboost_int) is responsive to the changed data. Similarly, responsive to completion of the first next program-verify iteration, the at least one control can again change data in the at least one latch, where the boosting of the channel region associated with the at least one storage element during the program portion of the second next program-verify iteration (at Vboost) is responsive to the again changed data.

An additional counter latch per storage element can be used when four possible boost conditions—Vboost_int1, Vboost_int2, Vboost_int3 and Vboost—are used for locked out storage elements. For example, the latches can be set to 00 at the start of the programming pass. For a given program loop, a change to 01 can indicate that Vboost_int1 is used, a change to 11 can indicate that Vboost_int2 is used, a change to 10 can indicate that Vboost_int3 is used, and a change to 00 can indicate that Vboost is used.

Figure 14:
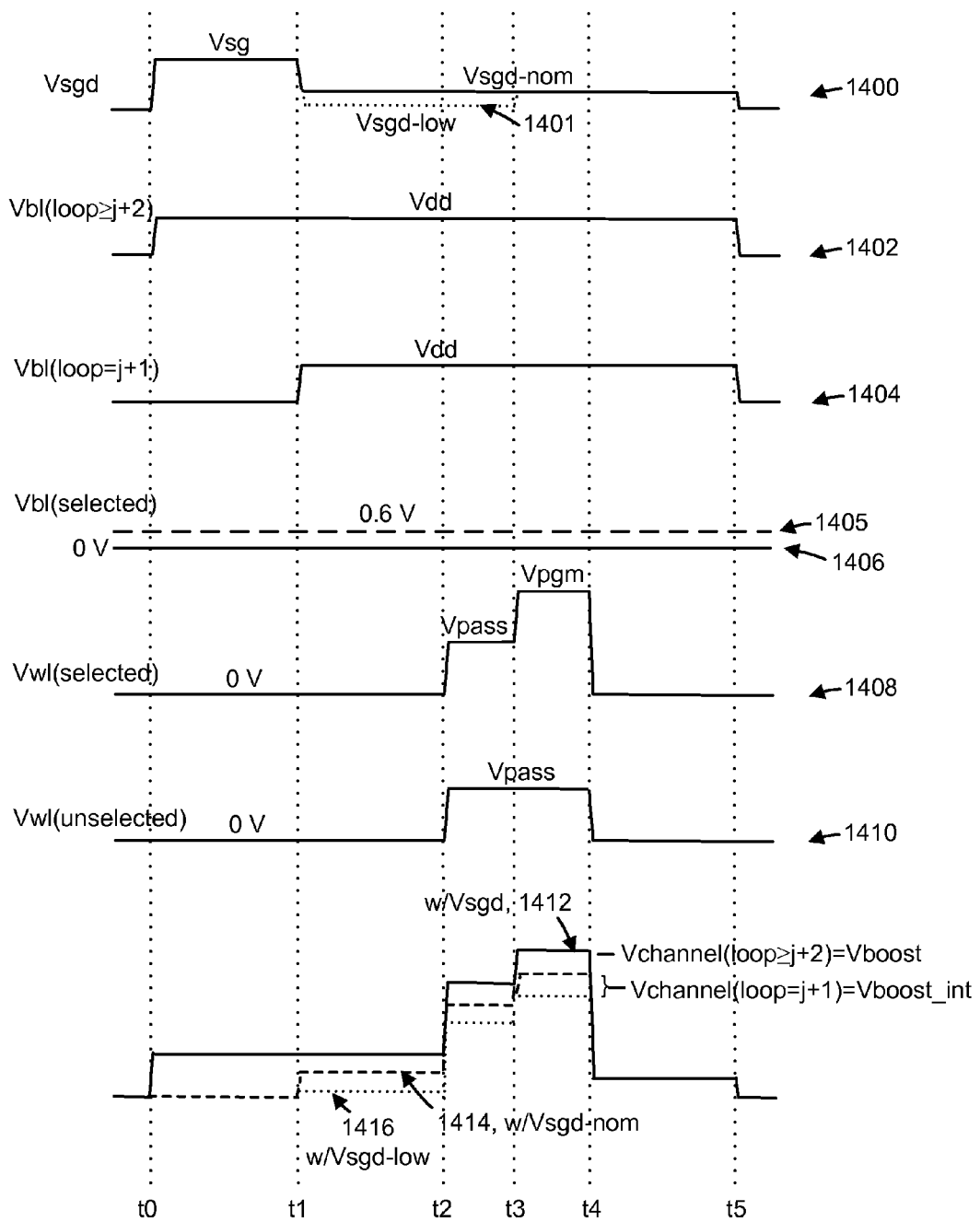
FIG. 14 depicts a first channel boosting technique.

FIG. 14 depicts a first channel boosting technique. The waveforms in the figures herein are not necessarily to scale. However, in FIGS. 14 and 16-18, the relative amplitudes of the Vchannel waveforms are enlarged to show detail, relative to the waveforms 1408 and 1410. As mentioned, it is desirable to provide reduced channel boosting for locked out (e.g., unselected) storage elements on the first program pulse after it is inhibited, to reduce coupling which can raise the Vth of a neighboring selected storage elements which is still undergoing programming. Generally, channel boosting can be provided via the use of specified voltages for bit lines, drain-side select gates and/or drain-side dummy storage elements, during a period before pass voltages are applied (also referred to as a pre-charge period), and/or during a period when pass voltages are applied. In this example, the period t0-t2 represents boosting via the use of specified voltages for bit lines and drain-side select gates, during a period before pass voltages are applied, and the period t2-t4 represents boosting during a period when pass voltages are applied to unselected word lines and a program voltage is applied to the selected word line.

Waveform 1400 represents a drain-side selected gate voltage, Vsgd, which is common to all bit lines. Waveform 1402 represents a voltage for bit lines associated with locked out storage elements for which the program loop number is j+2 or greater. Waveform 1404 represents a voltage for bit lines associated with locked out storage elements for which the program loop number is j+1. Waveforms 1405 and 1406 represents voltages for bit lines associated with selected storage elements. Waveform 1408 represents a voltage for the selected word line. Waveform 1410 represents a voltage for the unselected word lines. Waveform 1412 represents a channel voltage for the locked out storage elements for which the program loop number is j+2 or greater, where Vboost is reached just after the start of a time (t3) when Vpgm is applied. Waveform 1414 represents a channel voltage for the locked out storage elements for which the program loop number is j+1, where a higher Vboost_int is reached just after the start of the time when Vpgm is applied, due to the use of waveform 1400 for Vsgd. Waveform 1416 represents a channel voltage for the locked out storage elements for which the program loop number is j+1, where a lower Vboost_int is reached at a start of the time when Vpgm is applied, due to the use of waveform 1401 for Vsgd. The channel region associated with a storage element which has not been locked out is at a level which allows programming to continue, such as about 0-0.6 V.

Generally, pre-charge of a channel can occur when the bit line communicates with the channel. The SGD transistor is conductive between its source and drain when the gate voltage, Vsgd, exceeds the lower of the source and drain voltages by the Vth of the transistor. In one case, Vsgd=Vsg>Vbl+Vth, and most of Vbl is passed to the channel as the drain-to-source path of the transistor remains conductive. As an example, the drain (at Vbl) of the SGD transistor connected to the bit line, and the source (at Vchannel) of the SGD transistor is connected to the string of storage elements. To illustrate, assume Vsg=4 V, Vbl=2.5 V, and, initially, Vchannel=0 V. Here, Vchannel will rise to about 2.5V.

In a second case, Vsgd=Vsgd-nom<Vbl+Vth, and some of Vbl is passed to the channel when the drain-to-source path of the transistor is initially conductive, as a function of Vsgd, until Vchannel rises to a point which renders SGD non-conductive. Vchannel will rise to about Vsgd-nom–Vth. With Vsgd-nom=2.5 V and Vth=1 V, for instance, Vchannel will rise to about 2.5−1=1.5 V. At this point, Vsgd-nom=Vth+Vchannel, so that SGD becomes non-conductive and the channel floats.

In a third case, Vsgd=Vsgd-low<Vbl+Vth, and, again, some of Vbl is passed to the channel when the drain-to-source path of the transistor is initially conductive, as a function of Vsgd, until Vchannel rises to a point which renders SGD non-conductive. Vchannel will rise to about Vsgd-low–Vth. With Vsgd-low=1.5 V and Vth=1 V, for instance, Vchannel will rise to about 1.5−1=0.5 V. At this point, Vsgd-low=Vth+Vchannel, so that SGD becomes non-conductive and the channel floats.

When pass voltages are applied to the word line, a floated channel is boosted higher, as a function of the step size of the pass voltage, while a channel which is not floated is not boosted higher since it is in constant connection with the bit line which controls its voltage.

The programming portion of a program-verify iteration or program loop is depicted at t0-t5. Specifically, at waveform 1400, a common drain-side select gate voltage (Vsgd) is provided to the drain-side select gates of each NAND string. From t0-t1, Vsgd is raised from 0 V to Vsg. For the bit lines associated with the storage elements which are on the j+2th or later program loop, Vbl is raised from 0 V to Vdd, at waveform 1402. As a result, most of Vbl is passed to the channel, causing pre-charge boosting of the channel region (e.g., ~2.5 V), as depicted by waveform 1412.

At t1, Vsgd transitions from Vsg to a nominal value, Vsgd-nom, which is a desired level for when Vpgm is applied, causing the channel to float and maintain the pre-charge. Thus, t0-t2 is a pre-charge period for the inhibited storage elements for which the program loop number is j+2 or greater.

For the bit lines associated with the inhibited storage elements for which the program loop number is j+1, Vbl is at a 0 V from t0-t1 (waveform 1404). As a result, the associated drain-side select gates are in a conductive state, and the bit lines communicate with the channel regions of the NAND strings, grounding the channel regions from t0-t1, so that no channel boosting occurs (waveform 1414).

Also from t0-t1, the selected bit lines, that is, bit lines associated with selected storage elements, are at 0 V (waveform 1406) for a fast programming mode or at an elevated level such as 0.6 V (waveform 1405) for a slow programming mode. The selected word line (waveform 1408) and the unselected word lines (waveform 1410) are at 0 V.

At t1 in waveform 1404, Vbl is increased from 0 V to Vdd. As a result, the associated channels of the inhibited storage elements for which the program loop number is j+1, are pre-charged, as some amount of the bit line voltage reaches the channels before the drain-side select gates are cutoff and float the associated channels. A pre-charge level 1414 is less than a pre-charge level 1412 because the select gate is at a lower level than Vsg and therefore cannot pass the bit line voltage to the same extent. Thus, t1-t2 is a pre-charge period for the inhibited storage elements for which the program loop number is j+1. Alternatively, Vsgd is lowered from Vsg to Vsgd-low (waveform 1401), where Vsgd-low<Vsgd-nom, so that the channel is pre-charged to ~0.5 V (waveform 1416), to a lesser extent than waveform 1414. This approach results in a relatively low channel boosting.

At t2, Vpass (e.g., 6-8 V) is applied to the selected word line (waveform 1408) and the unselected word lines (waveform 1410). Since the channels belonging to inhibited storage elements are floating, Vpass couples to the channels of the storage elements so that the channel voltages are boosted by about the same amount. For example, about 0.5×Vpass may be coupled to the channel regions. For instance, with Vpass=8 V, the channel voltages may increase by about 4 V at t2. This provides a Vchannel of, e.g., ~6.5 V, ~5.5 V or ~4.5 V for waveforms 1412, 1414 and 1416, respectively, at t2. The program voltage is applied between t2 and t4, where t2-t3 represents a Vpass level of the program voltage and t3-t4 represents a Vpgm level of the program voltage.

At t3, Vpgm (e.g., 12-25 V) is applied to the selected word line (waveform 1408). This further voltage increase boosts the channel voltages 1412, 1414 and 1416 again by about the same amount, but by an amount (e.g., ~1.0 V) which is generally smaller than when Vpass is raised. This provides a Vchannel of, e.g., ~7.5 V, ~6.5 V or ~5.5 V for waveforms 1412, 1414 and 1416, respectively. For the case where Vsgd-low was applied from t1-t3 (waveform 1401), the Vsgd is ramped up to Vsgd-nom as Vpass is ramped up, so that the drain-side select gate is at an optimum level when Vpgm is applied and programming begins. The drain-side select gates can be cut off if Vsgd-nom is too low, even for the programming channels, causing programming to slow. With Vsgd at Vsgd-nom, the desired bit line voltage of, e.g., 0 V or 0.6 V, is maintained in the channel for selected storage elements.

As mentioned, the boosting effect of Vpgm (e.g., ~1.0 V) is smaller than that of Vpass (e.g., ~4 V) since Vpgm is applied to only one word line while Vpass is applied to almost all word lines. But, in general, the contribution of Vpgm and Vpass in total channel boost potential depends on the kind of boosting scheme that is used.

At t4, Vpass (1410) and Vpgm (1408) are removed, and the channel voltages of the unselected storage elements transition to about the same level (e.g., ~1 V), since all unselected bit line voltages are at the same level, and all drain-side select gate voltages are at the same level. Moreover, the channel boosting level at t4 will generally be less than the initial pre-charge levels from t0-t2. After t5, a remaining portion of the programming iteration which may include one or more verify operations is performed.

As a result, during the critical period from t3-t4, when Vpgm is applied, optimal channel boosting levels are provided based on the program loop number. Pre-charging from the bit line to the channel can be blocked by appropriate control of the drain-side select gate voltage, such as by applying Vsgd-low to the control gates.

Figure 15:
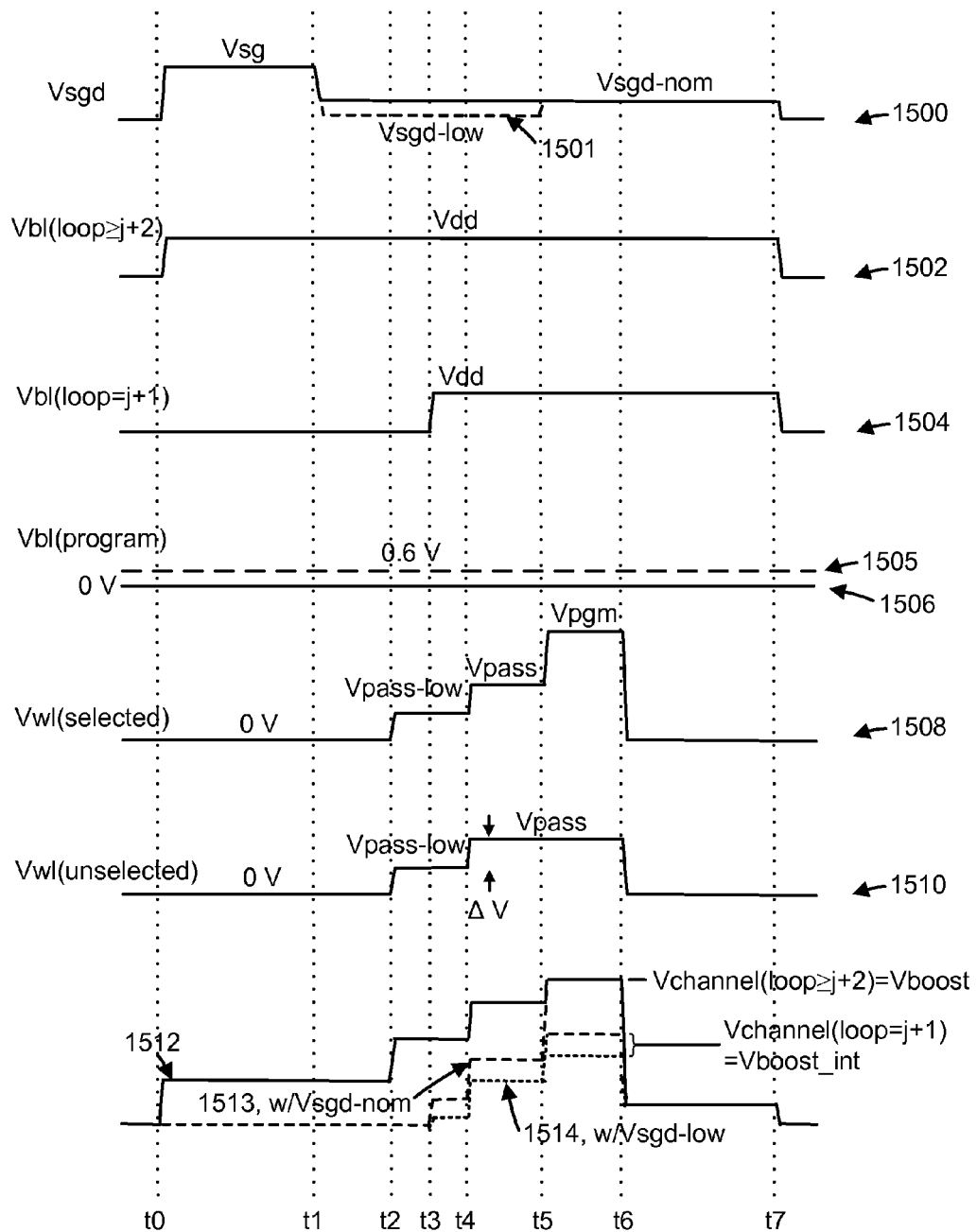
FIG. 15 depicts a second channel boosting technique.

FIG. 15 depicts a second channel boosting technique. By ramping Vpass in multiple steps instead of one step, different channel boosting levels can be achieved in different channels. In particular, lower boosting levels than in the boosting scheme of FIG. 14 can be achieved. Waveforms 1500, 1501, 1502, 1504, 1505 and 1506 are the same as waveforms 1400, 1401, 1402, 1404, 1405 and 1406, respectively, in FIG. 14. The channels of the storage elements for which the program loop is j+2 or later are boosted (waveform 1512) at t0, when Vsgd is raised to Vsg, with Vbl=Vdd. The channels of the storage elements for which the program loop is j+1 are not boosted until t3 when Vsgd-nom is used (see waveform 1513), or when Vsgd-low is used (see waveform 1514).

At t2, Vpass-low is applied (waveforms 1508 and 1510), causing higher boosting in the channels of the storage elements for which the program loop is j+2 or later (waveform 1512), as a function of the magnitude of the step of Vpass-low—0 V. Boosting can occur in the channels of the storage elements for which the program loop is j+2 or later because the drain-side select gates are non-conductive (since Vbl=Vdd), so the channels float. Boosting does not occur in the channels of the storage elements for which the program loop is j+1 because the drain-side select gates are conductive (since Vbl=0 V), so the channels are grounded.

In this example, the period t0-t2 represents boosting via the use of specified voltages for bit lines and drain-side select gates during a pre-charge period before pass voltages are applied, and the period t2-t6 represents boosting during a period when pass voltages are applied.

At t3, Vbl is raised to Vdd for the channels of the storage elements for which the program loop is j+1, resulting in a channel pre-charge of ~1.5 V when Vsgd-nom is used (waveform 1513) or ~0.5 V when Vsgd-low is used (waveform 1514). At t4, Vpass is applied (waveforms 1508 and 1510), causing higher boosting in the channels of the storage elements for which the program loop is j+2 or later (waveform 1512), and in the channels associated with the storage elements for which the program loop is j+1 (waveform 1513 or 1514), as a function of the magnitude of ΔV=Vpass−Vpass-low. At t5, Vpgm (waveform 1508) is applied, causing further, similar boosting in the channels of the storage elements for which the program loop is j+2 or later (waveform 1512) and the channels associated with the storage elements for which the program loop is j+1 (waveform 1513 or 1514). When Vsgd-low is used, at t5, Vsgd transitions from Vsgd-low to Vsgd-nom. It is safer to ensure that the select gate is at Vsgd-nom before the selected word line reaches Vpgm. Thus, the select gate may be raised from Vsgd-low to Vsgd-nom just before t5.

Thus, waveforms 1508 and 1510 indicate that the pass voltages are stepped up in multiple steps. Furthermore, waveforms 1502 and 1504 indicate that bit line voltages for the storage elements for which the program loop is j+2 or later are raised before the pass voltages are applied, and bit line voltages for the channels associated with the storage elements for which the program loop is j+1 are raised during one step of the multiple steps, prior to a last step of the multiple steps.

Specifically, the pass voltages are first stepped up from 0 V to a low level, Vpass-low, at t2, and stepped up again from Vpass-low to the nominal Vpass level at t4. Thus, 0<Vpass-low<Vpass. During the first ramp (at t2), Vbl for the storage elements for which the program loop is j+1 is 0 V, so no boosting occurs. Once the word lines have ramped up to Vpass-low, the bit lines are charged up to Vdd (1504). All inhibited storage element's bit line voltages remain at Vdd while the word lines are ramped from Vpass-low to Vpass. In this approach, the pre-charge is reduced/eliminated for the channels associated with the storage elements for which the program loop is j+1. Also, since their bit lines remain at 0 V during the ramp from 0 V to Vpass-low, no boosting occurs. Instead, the effective Vpass swing or difference for these channels is ΔV=Vpass–Vpass-low. Thus, the boosted potential for the channels associated with the storage elements for which the program loop is j+1 is reduced relative to the full boosting level, Vboost. In particular, lower boosting levels than in the boosting scheme of FIG. 14 can be achieved. Vpass-low can be optimized on a memory device to optimize the channel boosting for the storage elements for which the program loop is j+1. For more boosting, Vpass-low can be set lower, and for less boosting, Vpass-low can be set higher (for a given Vpass). A wide range of effective Vpass levels can be set. Vpass-low can be a configurable parameter which is set in the control, e.g., in a ROM fuse.

As an example, Vpass-low=4 V and Vpass=8 V, so that the Vpass steps at t2 and t4 each cause ~2 V channel boost. The Vpgm step at t5 causes ~1.0 V channel boost. In this example, Vchannel just after t5 is 7.5 V, 4.5 V and 3.5 V for waveforms 1512, 1513 and 1514, respectively.

Note that the delay from t2-t3 allows Vpass-low to reach and stabilize, e.g., in 2-3 μsec., at the intended level before Vbl (waveform 1504) is raised.

With this approach, from t5-t6, when Vpgm is applied, optimal channel boosting levels are provided.

Figure 16:
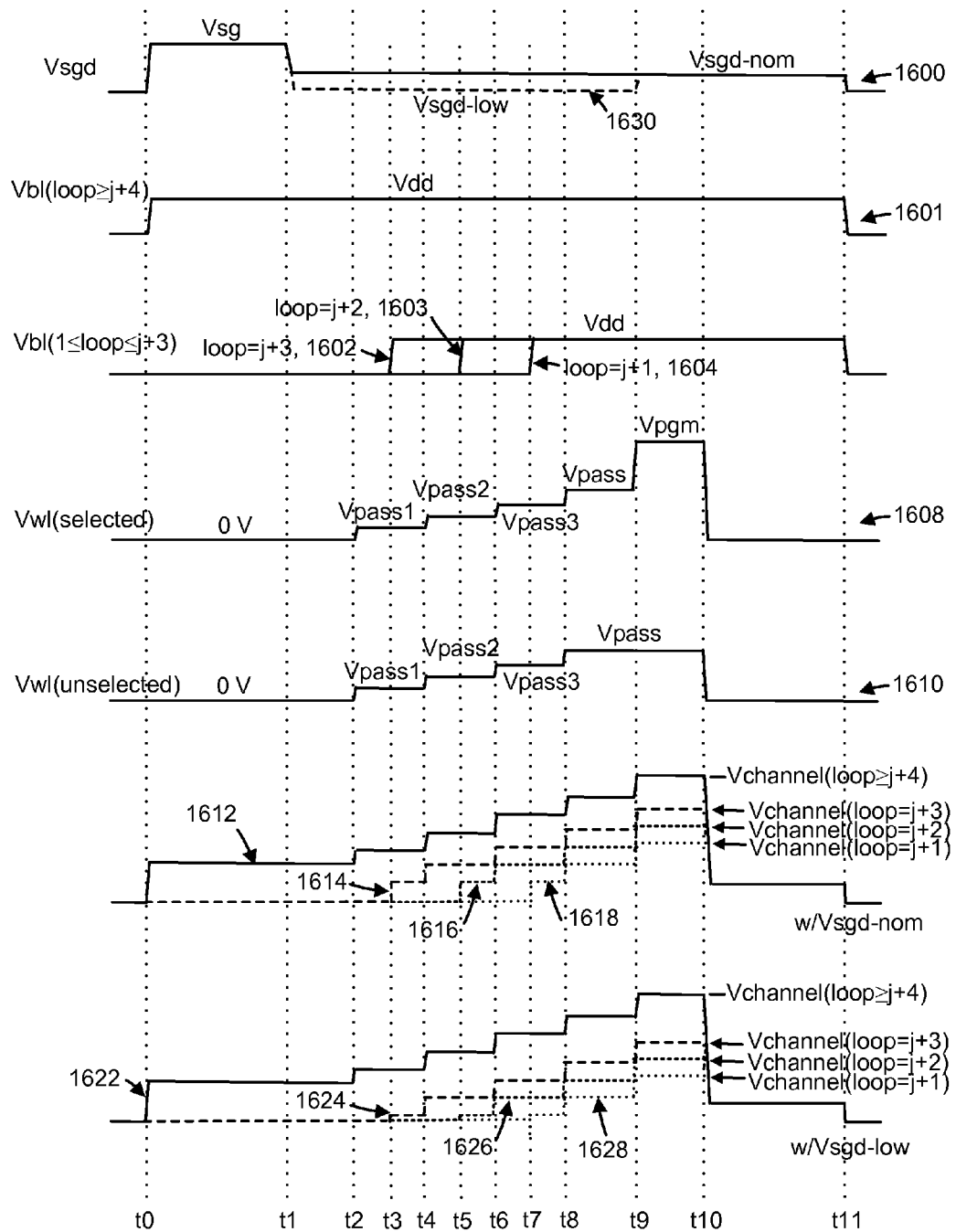
FIG. 16 depicts a third channel boosting technique.

FIG. 16 depicts a third channel boosting technique. Waveform 1600 denotes Vsgd where Vsgd-nom is used, waveform 1630 denotes Vsgd where Vsgd-low is used as an option, waveform 1601 denotes Vbl for storage elements for which the program loop is j+4 or later, waveform 1602 denotes Vbl for storage elements for which the program loop is j+3, waveform 1603 denotes Vbl for storage elements for which the program loop is j+2, waveform 1604 denotes Vbl for storage elements for which the program loop is j+1, waveform 1608 denotes the selected word line voltage, waveform 1610 denotes the unselected word line voltage, waveforms 1612 and 1622 equivalently denote channel boosting storage elements for which the program loop is j+4 of later, waveforms 1614, 1616 and 1618 denotes channel boosting for storage elements for which the program loop is j+3, j+2 or j+1, respectively, when Vsgd-nom is used, and waveforms 1624, 1626 and 1628 denote channel boosting for storage elements for which the program loop is j+3, j+2 or j+1, respectively, when Vsgd-low is used. Vbl (selected), not shown, is 0 V or 0.6 V, as discussed previously, for instance.

Here, when Vpass has been ramped up, the word line voltage can be ramped in four steps, with one step for each of the program loops j+1 through j+4. In FIG. 16, a ramp from 0 V to Vpass1 can occur at t2, a ramp from Vpass1 to Vpass2 can occur at t4, a ramp from Vpass2 to Vpass3 can occur at t6, and a ramp from Vpass3 to Vpass can occur at t8. See waveforms 1608 and 1610. Vpgm is applied at t9. The bit lines for the storage elements for which the program loop is j+3 can be raised at t3, when the word lines stabilize at Vpass1, the bit lines for the storage elements for which the program loop is j+2 can be raised at t5, when the word lines stabilize at Vpass2, and the bit lines for the storage elements for which the program loop is j+1 can be raised at t7, when the word lines stabilize at Vpass3. In this manner, the effective Vpass swing or difference can be individually controlled by adjusting Vpass1, Vpass2 and Vpass3.

Another possible approach is to use the same channel boosting level for a group of two or more program loops. For example, a first boosting level could be used for the j+1 and j+2 program loops, while a second boosting level is used for the j+3 program loop, and a third boosting level is used for the j+4 and later program loops. Or, the second boosting level can be used for the j+3, j+4 and later program loops. Other variations are possible.

Generally, the amount of channel boosting experienced is a function of a sum of the pass voltage step sizes when the channel is floated, e.g., when Vbl is raised. Thus, the channel for the storage elements on the j+3 program loop will be boosted by a function of Vpass-Vpass1, the channel for the storage elements on the j+2 program loop will be boosted by a function of Vpass-Vpass2, and the channel for the storage elements on the j+1 program loop will be boosted by a function of Vpass-Vpass3. Note that the step sizes can vary for the different Vpass voltages, and need not be uniform. Moreover, Vpass1, Vpass2 and Vpass3 can be configurable in the control of the memory device, e.g., in a ROM fuse: They can be adjusted and optimized.

When Vsgd-nom is used, a pre-charge of, e.g., 1.5 V, is experienced for the channels of the storage elements on the j+3, j+2 and j+1 program loops, respectively (waveforms 1614, 1616 and 1618). When Vsgd-low is used, a pre-charge of, e.g., 0.5 V, is experienced for the channels of the storage elements on the j+3, j+2 and j+1 program loops, respectively (waveforms 1624, 1626 and 1628).

As an example, Vpass1=2 V, Vpass2-Vpass1=2 V, Vpass3-Vpass2=2 V and Vpass-Vpass3=2 V. The Vpgm step at t5 causes ~1.0 V channel boost. In this example, Vchannel just after t9 is 2.5+1+1+1+1.0=7.5 V (waveform 1612 or 1622), and with Vsgd-nom, 1.5+1+1+1.0=5.5 V (waveform 1614), 1.5+1+1.0=4.5V (waveform 1616), or 1.5+1+1.0=3.5 V (waveform 1618). With Vsgd-low, we have 0.5+1+1+1+1.0=4.5 V (waveform 1624), 0.5+1+1+1.0=3.5 V (waveform 1626), or 0.5+1+1.0=2.5 V (waveform 1628).

In one embodiment of the technology described herein, a method is provided for programming a set of storage elements which is formed on a substrate, and which is in communication with a set of word lines, where the set of storage elements includes at least one storage element in communication with a selected word line of the set of word lines. The method includes performing a number of program-verify iterations for the selected word line, and determining when the at least one storage element has been programmed sufficiently so that the at least one storage element reaches a lockout condition, where the at least one storage element reaches the lockout condition during an associated program-verify iteration of the number of program-verify iterations. The method further includes, during a program portion of a first next program-verify iteration which is immediately after the associated program-verify iteration, boosting a channel region, associated with the at least one storage element to a first lockout level, while a channel region associated with at least one other one storage element of the set of storage elements, in communication with the selected word line, is at a level which allows programming to continue. The method further includes, during a program portion of a second next program-verify iteration which is immediately after the first next program-verify iteration, boosting the channel region associated with the at least one storage element to a second lockout level, higher than the first lockout level, while the channel region associated with the at least one other one storage element is at a level which allows programming to continue.

In another embodiment, a method of the above-mentioned type includes performing a number of program-verify iterations for the selected word line, where a loop number is incremented with each program-verify iteration. The method further includes, during the number of program-verify iterations, determining when the storage elements of the first set of storage elements reach an associated verify level. The method further includes, for each storage element of the set of storage elements which reaches the associated verify level, boosting an associated channel region during a program portion of a program-verify iteration which is immediately after a program-verify iteration at which the storage element reaches the associated verify level, where a level of the boosting is a function of the loop number of the program-verify iteration at which the storage element reaches the associated verify level.

In another embodiment, a method of the above-mentioned type includes performing a number of program-verify iterations for the selected word line, and determining when the at least one storage element reaches a lockout condition, where the at least one storage element reaches the lockout condition during an associated program-verify iteration of the number of program-verify iterations. The method further includes, during a program portion of at least one subsequent program-verify iteration, which is after the associated program-verify iteration, boosting a channel region, associated with the at least one storage element, while at least one other one storage element of the set of storage elements, in communication with the selected word line, continues to be programmed, where the boosting is responsive to a timing of the at least one subsequent program-verify iteration relative to the associated program-verify iteration.

In another embodiment, a non-volatile storage system is provided which includes a set of non-volatile storage elements formed on a substrate, a set of word lines in communication with the set of non-volatile storage elements, and at least one storage element in the set of non-volatile storage elements is in communication with a selected word line of the set of word lines. Further, at least one control circuit is in communication with the set of word lines. The at least one control circuit: (a) performs a number of program-verify iterations for the selected word line, (b) determines when the at least one storage element reaches a lockout condition, where the at least one storage element reaches the lockout condition during an associated program-verify iteration of the number of program-verify iterations, (c) during a program portion of a first next program-verify iteration which is immediately after the associated program-verify iteration, boosts a channel region, associated with the at least one storage element to a first lockout level, while a channel region associated with at least one other one storage element of the set of storage elements, in communication with the selected word line, is at a level which allows programming to continue, and (d) during a program portion of a second next program-verify iteration which is immediately after the first next program-verify iteration, boosts the channel region associated with the at least one storage element to a second lockout level, higher than the first lockout level, while the channel region associated with the at least one other one storage element is at a level which allows programming to continue.

Corresponding methods, systems and computer-or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for programming a set of storage elements which is formed on a substrate, and which is in communication with a set of word lines, where the set of storage elements includes one storage element and another storage element in communication with a selected word line of the set of word lines, the method comprising:
   performing a plurality of program-verify iterations for the selected word line;
   determining when the one storage element has been programmed sufficiently so that the one storage element reaches a lockout condition, where the one storage element reaches the lockout condition during an associated program-verify iteration of the plurality of program-verify iterations;
   during a program portion of a first next program-verify iteration which is immediately after the associated program-verify iteration, boosting a channel region, associated with the one storage element to a first lockout level, while a channel region associated with the another storage element is at a level which allows programming to continue; and
   during a program portion of a second next program-verify iteration which is immediately after the first next program-verify iteration, boosting the channel region associated with the one storage element to a second lockout level, higher than the first lockout level, while the channel region associated with the another storage element is at a level which allows programming to continue, the boosting the channel region associated with the one storage element to the first lockout level and the boosting the channel region associated with the one storage element to the second lockout level comprise controlling a time at which the channel region associated with the one storage element begins floating while a pass voltage is stepped up on unselected word lines of the set of word lines.

2. The method of claim 1, further comprising:
responsive to the determining, changing data in a latch which is associated with the one storage element to provide changed data, where the boosting of the channel region associated with the one storage element during the program portion of the first next program-verify iteration is responsive to the changed data.

3. The method of claim 2, further comprising:
responsive to completion of the first next program-verify iteration, again changing data in the latch to provide again changed data, where the boosting of the channel region associated with the at least one storage element during the program portion of the second next program-verify iteration is responsive to the again changed data.

4. The method of claim 1, further comprising:
during a program portion of each remaining program-verify iteration after the second next program-verify iteration, until a current programming pass is completed, boosting the channel region associated with the one storage element to the second lockout level.

5. The method of claim 1, wherein:
during a program portion of a third next program-verify iteration which is immediately after the second next program-verify iteration, boosting the channel region associated with the one storage element to a third level, higher than the second lockout level, while the channel region associated with the another storage element is at a level which allows programming to continue; and
during a program portion of a fourth next program-verify iteration which is immediately after the third next program-verify iteration, boosting the channel region associated with the one storage element to a fourth level, higher than the third level, while the channel region associated with the another one storage element is at a level which allows programming to continue.

6. The method of claim 1, wherein:
the plurality of program-verify iterations, the first next program-verify iteration and the second next program-verify iteration, are in a common programming pass.

7. The method of claim 6, wherein:
the programming pass is a final programming pass of a multi-pass programming operation or before the final prgramming pass of the multi-pass programming operation.

8. The method of claim 6, wherein:
the time at which the channel region associated with the one storage element begins floating while the pass voltage is stepped up on the unselected word lines is relatively sooner in the program portion of the second next program-verify iteration than in the program portion of the forst next program-verify iteration.

9. The method of claim 1, wherein:
the one storage element is arranged in a NAND string comprising a drain-side select gate connected to a bit line; and
the controlling the time at which the channel region associated with the one storage element begins floating while the pass voltage is stepped up on the unselected word lines comprises controlling a voltage of the respective bit line of the NAND string.

10. The method of claim 9, wherein:
the NAND string of the one storage element is in communication with a bit line, and during the program portion of the first next program-verify iteration:
the channel is boosted to the first lockout level by allowing the bit line to communicate with the NAND string of the one storage element while raising a pass voltage on unselected word lines of the set of word lines, after which the bit line is prevented from communicating with the NAND string of the one storage element while the pass voltage on the unselected word lines of the set of word lines is raised further.

11. The method of claim 9, wherein:
the NAND string of the one storage element is in communication with a bit line, and during the program portion of the second next program-verify iteration: the channel is boosted to the second lockout level by allowing the bit line to communicate with the NAND string of the one storage element while raising a pass voltage on unselected word lines of the set of word lines, then allowing the bit line to communicate with the NAND string of the one storage element while further raising the pass voltage on the unselected word lines of the set of word lines.

12. The method of claim 1, wherein:
the one storage element has been programmed sufficiently when a threshold voltage of the at least one storage element has been raised to above a target verify level associated with a data state which is above an erased data state.

13. A method for programming a set of storage elements which are formed on a substrate, and which are in communication with a selected word line, the method comprising:
performing a plurality of program-verify iterations for the selected word line, where a loop number is incremented with each program-verify iteration;
during the plurality of program-verify iterations, determining when the storage elements of the set of storage elements reach an associated verify level; and
for each storage element of the set of storage elements which reaches the associated verify level, boosting an associated channel region during a program portion of a program-verify iteration which is immediately after a program-verify iteration at which the storage element reaches the associated verify level, where a level of the boosting is a function of the loop number of the program-verify iteration at which the storage element reaches the associated verify level.

14. The method of claim 13, wherein:
the level of the boosting is a function of a data state of the associated verify level.

15. The method of claim 13, wherein:
for each storage element of the set of storage elements which reaches the associated verify level, the level of the boosting is a first lockout level when the loop number of the program-verify iteration at which the storage element reaches the associated verify level is within a first range of successive loop numbers, and the level of the boosting is a second lockout level when the loop number of the program-verify iteration at which the storage element reaches the associated verify level is within a second range of successive loop numbers.

16. The method of claim 15, wherein:
for each storage element of the set of storage elements which reaches the associated verify level, the level of the boosting is the first lockout level when the loop number of the program-verify iteration at which the storage element reaches the associated verify level is within a third range of successive loop numbers, the third range is after the second range, and the second range is after the first range.

17. The method of claim 15, further comprising:
storing data in ROM fuse which identifies the first and second ranges of successive loop numbers.

18. A non-volatile storage system which performs the method of claim 13.

19. A method for programming a set of storage elements which is formed on a substrate, and which is in communication with a set of word lines, where the set of storage elements includes at least one storage element in communication with a selected word line of the set of word lines, the method comprising:
performing a plurality of program-verify iterations for the selected word line;
determining when the at least one storage element reaches a lockout condition, where the at least one storage element reaches the lockout condition during an associated program-verify iteration of the plurality of program-verify iterations; and
during a program portion of at least one subsequent program-verify iteration, which is after the associated program-verify iteration, boosting a channel region, associated with the at least one storage element, while at least one other one storage element of the set of storage elements, in communication with the selected word line, continues to be programmed, where the boosting is responsive to a timing of the at least one subsequent program-verify iteration relative to the associated program-verify iteration.

20. The method of claim 19, wherein:
at least one subsequent program-verify iteration includes a first program-verify iteration and a subsequent second program-verify iteration; and
the boosting is lower during a program portion of the first program-verify iteration than during a program portion of the second program-verify iteration.

21. A non-volatile storage system which performs the method of claim 19.

22. A non-volatile storage system, comprising:
a set of non-volatile storage elements formed on a substrate;
a set of word lines in communication with the set of non-volatile storage elements;
at least one storage element in the set of non-volatile storage elements is in communication with a selected word line of the set of word lines; and
at least one control circuit in communication with the set of word lines, the at least one control circuit: (a) performs a plurality of program-verify iterations for the selected word line, (b) determines when the at least one storage element reaches a lockout condition, where the at least one storage element reaches the lockout condition during an associated program-verify iteration of the plurality of program-verify iterations, (c) during a program portion of a first next program-verify iteration which is immediately after the associated program-verify iteration, boosts a channel region, associated with the at least one storage element to a first lockout level, while a channel region associated with at least one other one storage element of the set of storage elements, in communication with the selected word line, is at a level which allows programming to continue, and (d) during a program portion of a second next program-verify iteration which is immediately after the first next program-verify iteration, boosts the channel region associated with the at least one storage element to a second lockout level, higher than the first lockout level, while the channel region associated with the at least one other one storage element is at a level which allows programming to continue.

23. The non-volatile storage system of claim 22, further comprising:
at least one latch which is associated with the at least one storage element, the at least one control circuit, responsive to the determining, changes data in the at least one latch, and the at least one control circuit boost the channel region associated with the at least one storage element during the program portion of the first next program-verify iteration responsive to the changed data.

24. The non-volatile storage system of claim 23, wherein:
the at least one control circuit, responsive to completion of the first next program-verify iteration, again changes data in the at least one latch to provide again changed data, and the at least one control circuit boosts the channel region associated with the at least one storage element during the program portion of the second next program-verify iteration responsive to the again changed data.

25. The non-volatile storage system of claim 22, wherein:
the at least one control circuit boosts the channel region associated with the at least one storage element to the second lockout level during a program portion of each remaining program-verify iteration after the second next program-verify iteration, until a current programming pass is completed.

26. The non-volatile storage system of claim 22, wherein:
the set of storage elements are arranged in NAND strings and are programmed using all bit line programming, and the channel region which is associated with the at least one storage element extends in the substrate under a NAND string of the at least one storage element.

27. The non-volatile storage system of claim 26, wherein the NAND string of the at least one storage element in is communication with a bit line, and during the program portion of the first next program-verify iteration:
the at least one control circuit, to boost the channel region associated with the at least one storage element to the first lockout level, allows the bit line to communicate with the NAND string of the at least one storage element while raising a pass voltage on unselected word lines of the set of word lines, after which the bit line is prevented from communicating with the NAND string of the at least one storage element while the pass voltage on the unselected word lines of the set of word lines is raised further.

28. The non-volatile storage system of claim 27, wherein the NAND string of the at least one storage element in is communication with a bit line, and during the program portion of the second next program-verify iteration:
the at least one control circuit, to boost the channel region associated with the at least one storage element to the second lockout level, allows the bit line to communicate with the NAND string of the at least one storage element while raising the pass voltage on the unselected word lines of the set of word lines, and allows the bit line to communicate with the NAND string of the at least one storage element while further raising the pass voltage on unselected word lines of the set of word lines.

* * * * *

UNITED STATES PATENT AND TRADEMARK OFFICE
CERTIFICATE OF CORRECTION

PATENT NO. : 8,369,149 B2
APPLICATION NO. : 12/894889
DATED : February 5, 2013
INVENTOR(S) : Dutta et al.

It is certified that error appears in the above-identified patent and that said Letters Patent is hereby corrected as shown below:

In the Claims, Column 27, claim 7, lines 23-24, please delete "final prgramming" and replace with --final programming--.

In the Claims, Column 27, claim 8, line 32, please delete "the forst next" and replace with --the first next--.

Signed and Sealed this
Twenty-eighth Day of May, 2013

Teresa Stanek Rea
*Acting Director of the United States Patent and Trademark Office*